US011476845B2

(12) United States Patent
Fontana et al.

(10) Patent No.: US 11,476,845 B2
(45) Date of Patent: Oct. 18, 2022

(54) DRIVER CIRCUIT, CORRESPONDING DEVICE AND METHOD OF OPERATION

(71) Applicant: STMicroelectronics S.r.l., Agrate Brianza (IT)

(72) Inventors: Marco Giovanni Fontana, Milan (IT); Marco Riva, Lallio (IT); Francesco Pulvirenti, Acireale (IT); Giuseppe Cantone, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/355,055

(22) Filed: Jun. 22, 2021

(65) Prior Publication Data
US 2022/0006450 A1    Jan. 6, 2022

(30) Foreign Application Priority Data

Jul. 2, 2020 (IT) .......................... 102020000016072

(51) Int. Cl.
| | | |
|---|---|---|
| *H03K 5/151* | (2006.01) | |
| *H03K 17/16* | (2006.01) | |
| *H03K 17/687* | (2006.01) | |
| *H03K 17/06* | (2006.01) | |
| *H03K 17/0812* | (2006.01) | |

(52) U.S. Cl.
CPC ..... *H03K 17/063* (2013.01); *H03K 17/08122* (2013.01); *H03K 2217/0063* (2013.01); *H03K 2217/0072* (2013.01); *H03K 2217/0081* (2013.01)

(58) Field of Classification Search
None
See application file for complete search history.

(56) References Cited

U.S. PATENT DOCUMENTS

| | | |
|---|---|---|
| 7,215,189 B2 | 5/2007 | Wilhelm |
| 7,456,658 B2 | 11/2008 | Locatelli et al. |
| 7,538,583 B2 | 5/2009 | Bryson |
| 8,593,211 B2 | 11/2013 | Forghani-Zadeh et al. |

(Continued)

FOREIGN PATENT DOCUMENTS

| | | |
|---|---|---|
| JP | 2018-7403 A | 1/2018 |
| WO | 2016/057878 A1 | 4/2016 |
| WO | 2019/193805 A1 | 10/2019 |

*Primary Examiner* — Kenneth B Wells
(74) *Attorney, Agent, or Firm* — Seed IP Law Group LLP

(57) ABSTRACT

A circuit comprises first and second input supply nodes configured to receive a supply voltage therebetween. The circuit comprises a high-side driver circuit configured to be coupled to a high-side switch and produce a first signal between first and second high-side output nodes. The circuit comprises a low-side driver circuit configured to be coupled to a low-side switch and produce a second signal between first and second low-side output nodes. The circuit comprises a floating node configured to receive a floating voltage applied between the floating node and the second high-side output node, a bootstrap diode between the first input supply node and an intermediate node, and a current limiter circuit between the intermediate node and the floating node and configured to sense the floating voltage and counter a current flow from the intermediate node to the floating node as a result of the floating voltage reaching a threshold value.

21 Claims, 8 Drawing Sheets

(56) References Cited

U.S. PATENT DOCUMENTS

| | | | |
|---|---|---|---|
| 9,859,883 B2* | 1/2018 | Huang | H03K 17/162 |
| 2002/0159276 A1* | 10/2002 | Deboy | H02M 3/33507 |
| | | | 363/20 |
| 2008/0290841 A1 | 11/2008 | Chang et al. | |
| 2020/0044650 A1* | 2/2020 | Fujita | H01H 9/542 |
| 2021/0044290 A1 | 2/2021 | Hama et al. | |

* cited by examiner

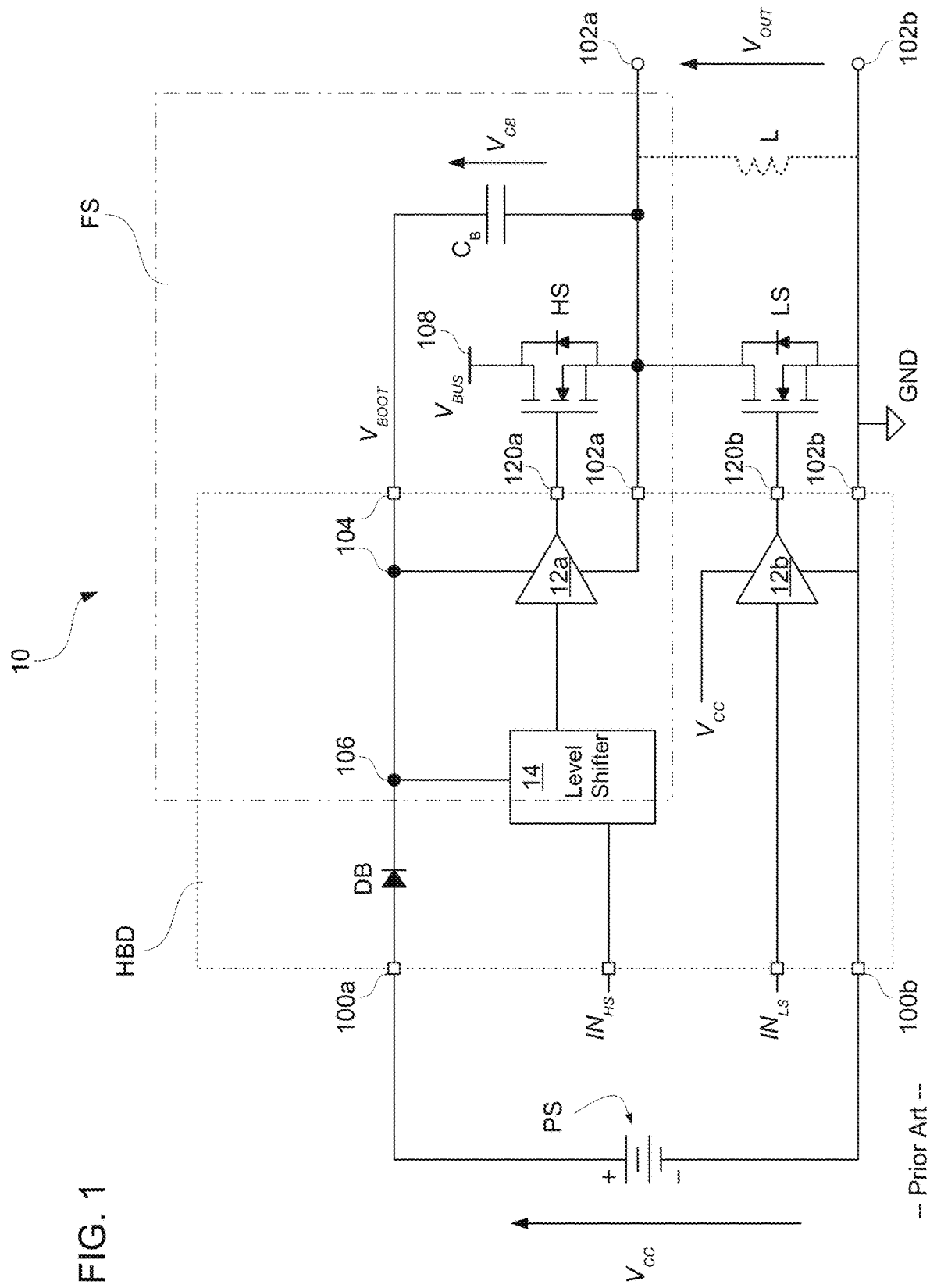
FIG. 1 -- Prior Art --

-- Prior Art --

-- Prior Art --

-- Prior Art --

-- Prior Art --

-- Prior Art --

-- Prior Art --

DRIVER CIRCUIT, CORRESPONDING DEVICE AND METHOD OF OPERATION

BACKGROUND

Technical Field

The description relates to half-bridge switching circuits with high-side bootstrap architecture.

Description of the Related Art

High voltage (HV) half-bridge switching circuits as known in the art may be used in various applications such as motor driver devices, electronic ballasts for fluorescent lamps, power supply devices and other devices.

Gallium nitride (GaN) power transistors are increasingly used in half-bridge switching circuits in the place of conventional power transistors (such as conventional silicon MOS field-effect transistors or insulated-gate bipolar transistors, IGBT) with the aim of improving the overall efficiency of the switching circuits. For instance, GaN power transistors may provide lower gate capacitance and higher switching speed.

Known circuit arrangements for driving GaN power transistors in half-bridge switching circuits may not provide satisfactory performance in terms of efficiency and/or robustness.

BRIEF SUMMARY

An object of one or more embodiments is to provide driver circuits for half-bridge switching circuits with improved efficiency and/or robustness.

For instance, such a circuit may be fully integrated in a monolithic integrated circuit (IC) or chip.

One or more embodiments may relate to a corresponding device (e.g., an active clamp flyback converter, or a resonant LLC converter).

One or more embodiments may relate to a corresponding method of operating the circuit or the device.

According to one or more embodiments, a circuit may include a first input supply node and a second input supply node configured to receive a first supply voltage applied therebetween, a first input control node configured to receive a first input control signal and a second input control node configured to receive a second input control signal. The circuit may include a high-side driver circuit configured to be coupled to a high-side switch of a half-bridge circuit, the high-side driver circuit being configured to receive the first input control signal and produce a first output control signal between a first high-side output node and a second high-side output node for controlling the high-side switch. The circuit may include a low-side driver circuit configured to be coupled to a low-side switch of the half-bridge circuit, the low-side driver circuit being configured to receive the second input control signal and produce a second output control signal between a first low-side output node and a second low-side output node for controlling the low-side switch. The circuit may include a floating supply node configured to receive a floating supply voltage applied between the floating supply node and the second high-side output node. The high-side driver circuit may be electrically coupled between the floating supply node and the second high-side output node to receive the floating supply voltage. The circuit may include a bootstrap diode having an anode coupled to the first input supply node and a cathode coupled to an intermediate supply node, and a current limiter circuit coupled between the intermediate supply node and the floating supply node. The current limiter circuit may be configured to sense the floating supply voltage and to counter a current flow from the intermediate supply node to the floating supply node as a result of the floating supply voltage reaching a threshold value.

BRIEF DESCRIPTION OF THE SEVERAL VIEWS OF THE DRAWINGS

One or more embodiments will now be described, by way of example only, with reference to the annexed figures.

FIG. 1 is a circuit block diagram exemplary of a half-bridge switching circuit and related driving circuitry including a high-side bootstrap architecture.

DETAILED DESCRIPTION

Figure 2A:
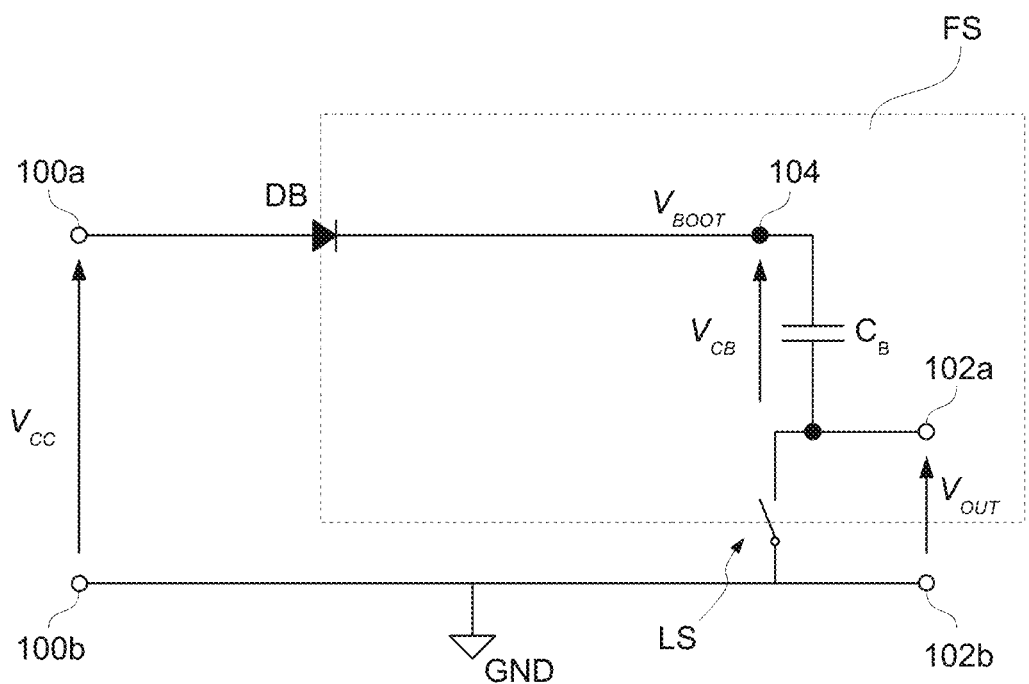
FIGS. 2A, 3A and 4A are circuit block diagrams exemplary of various bootstrap architectures for a half-bridge switching circuit.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

By way of introduction to the detailed description of exemplary embodiments, reference may be first made to FIG. 1.

FIG. 1 is a circuit block diagram exemplary of a half-bridge switching circuit and related driving circuitry, wherein the driving circuitry relies on a conventional high-side bootstrap architecture.

As exemplified in FIG. 1, the half-bridge switching circuit 10 comprises a high-side power transistor HS and a low-side power transistor LS having a node 102a intermediate the high-side power transistor HS and the low-side power transistor LS.

The high-side transistor HS is configured to provide a current flow line between a DC high voltage supply rail 108 providing a DC voltage $V_{BUS}$ and the intermediate node 102a (e.g., a drain terminal of the high-side transistor HS may be coupled to the positive DC high voltage rail 108 and a source terminal of the high-side transistor HS may be coupled to node 102a).

The low-side transistor LS is configured to provide a current flow line between the intermediate node 102a and a reference voltage node 102b, e.g., coupled to a ground GND (e.g., a drain terminal of the low-side transistor LS may be coupled to node 102a and a source terminal of the low-side transistor LS may be coupled to the reference GND of the DC high voltage rail).

According to different applications of embodiments, the value of the DC voltage $V_{BUS}$ may be selected in a wide range of values, e.g., between 20 V and 1 kV. Purely by way of non-limiting example, the value of the DC voltage $V_{BUS}$ may be approximately 190 V.

The pair of nodes 102a, 102b may thus be configured to provide an output voltage $V_{OUT}$ to an (external) load L which may be coupled therebetween (e.g., the transistors HS, LS may be arranged according to a so-called totem pole configuration). As exemplified in FIG. 1, the load L may be an inductive load.

It is noted that a load L is illustrated coupled between nodes 102a, 102b purely by way of non-limiting example. According to various embodiments, the circuit may be applied to a wide variety of load topologies.

It is noted that the high-side and low-side transistors HS, LS may comprise respective drain-body diodes as illustrated in FIG. 1. The high-side and low-side transistors HS, LS may comprise gallium nitride (GaN) power transistors, optionally enhancement GaN power transistors.

The half-bridge switching circuit 10 may comprise a pair of input terminals 100a, 100b configured to receive therebetween a supply voltage $V_{CC}$ from a power source PS coupled thereto. The (negative) input terminal 100b may be coupled to the same reference voltage node GND previously described. Thus, the input terminals 100a, 100b may provide a DC low voltage supply rail.

The supply voltage $V_{CC}$ may supply a half-bridge driving circuit HBD which is configured to control the switching activity of the transistors HS, LS. In particular, the half-bridge driving circuit HBD may receive input control signals $IN_{HS}$ and $IN_{LS}$ for controlling the switching activity of the transistors HS and LS, respectively. In one or more embodiments, the driver circuit HBD may be fully integrated in a monolithic integrated circuit (IC).

According to different applications of embodiments, the value of the supply voltage $V_{CC}$ may be selected in a range of values, e.g., between 5 V and 24 V. In particular, in the specific case of a driver circuit HBD driving enhancement GaN power transistors, the supply voltage $V_{CC}$ may be approximately 5 V.

As exemplified in FIG. 1, the half-bridge driving circuit HBD may comprise a high-side gate driver circuit 12a (e.g., a buffer stage) providing at an output node 120a a control signal for the high-side transistor HS, and a low-side gate driver circuit 12b (e.g., a buffer stage) providing at an output node 120b a control signal for the low-side transistor LS.

The input control signal $IN_{LS}$ may be (directly) propagated to the low-side gate driver circuit 12b. The input control signal $IN_{HS}$ may be propagated to the high-side gate driver circuit 12a by means of a level shifter circuit 14 configured to transfer the input control signal $IN_{HS}$ from the low voltage section of circuit 10 between terminals 100a and 100b ($V_{CC}$ to GND) to a floating section FS of circuit 10 between nodes 104 and 102a ($V_{BOOT}$ to $V_{OUT}$).

As exemplified in FIG. 1, a bootstrap architecture may be used to generate a DC voltage supply $V_{CB}$ between the nodes 104 and 102a, with the DC voltage supply $V_{CB}$ being floating with respect to the DC low voltage supply rail $V_{CC}$ so as to provide a floating section FS of the half-bridge switching circuit 10. Thus, the DC voltage supply $V_{CB}$ may be derived from the DC low voltage supply rail $V_{CC}$, for example, by providing a high voltage diode DB having the anode coupled to the positive terminal 100a of the DC low voltage supply rail $V_{CC}$ and the cathode coupled to the floating supply voltage node 104.

As exemplified in FIG. 1, a bootstrap capacitance $C_B$ (e.g., a capacitor mounted externally to the circuit 10) provided between the (positive) output terminal 102a and the floating supply voltage node 104 may be configured to store charge (during a bootstrap "recharge" phase) in order to provide the DC voltage supply $V_{CB}$ for supplying (during a bootstrap "supply" phase) the high-side gate driver circuit 12a, as described in the following.

The value of the bootstrap capacitance $C_B$ may be selected as a function of a set of parameters, such as for instance the gate-source capacitance of the power transistors HS and LS, the output frequency and duty cycle. Therefore, according to different applications of embodiments, the value of the bootstrap capacitance $C_B$ may be selected in a wide range of values, e.g., between some tens of nF (1 nF=$10^{-9}$ F) and some µF (1 µF=$10^{-6}$ F). Purely by way of non-limiting example, the value of the bootstrap capacitance $C_B$ may be approximately 100 nF.

As a result of the low-side transistor LS being turned on (bootstrap recharge phase), the (positive) output terminal 102a is coupled to the reference voltage node GND (e.g., 0 V) and the diode DB allows a current to flow from the positive terminal 100a of the DC low voltage supply rail $V_{CC}$ to the bootstrap capacitance $C_B$, thereby charging the bootstrap capacitance $C_B$ to a voltage level approximately equal to $V_{CC}$. As a result of the low-side transistor LS being turned off and the high-side transistor HS being turned on (bootstrap supply phase), the voltage at the (positive) output terminal 102a assumes a voltage level approximately equal to $V_{BUS}$, which causes the diode DB becoming reverse biased (insofar as the node 104 assumes a voltage value $V_{BOOT}$ approximately equal to $V_{CC}+V_{BUS}$) and countering the current flow from the bootstrap capacitance $C_B$ to node 100a. As a result of the diode DB remaining reverse biased, the charge stored in the bootstrap capacitance $C_B$ may supply the high-side gate driver circuit 12a. However, the limited amount of charge stored in the bootstrap capacitance $C_B$ may supply the high-side gate driver circuit 12a for a finite amount time. At a subsequent switching cycle, with the high-side transistor HS turned off and the low-side transistor LS turned on again, the charge in the bootstrap capacitance $C_B$ may be restored.

Therefore, in a half-bridge switching circuit 10 as exemplified in FIG. 1, the gate-source voltage of the high-side transistor HS may be provided by means of a bootstrap capacitance $C_B$ which supplies the gate driver circuit 12a. It is noted that the gate-source voltage of enhancement GaN power transistors may advantageously be limited to less than 6 V, e.g., so to satisfy certain technology requirements. Therefore, improved solutions may aim at limiting the voltage $V_{CB}$ across the bootstrap capacitance $C_B$ to a value lower than an upper threshold, e.g., 6 V.

It is also noted that, in order to improve the power efficiency of the high-side transistor HS, the bootstrap capacitance $C_B$ may benefit from being charged as much as possible (within the limit discussed above), e.g., so to achieve a bootstrap voltage $V_{CB}$ higher than a lower threshold, e.g., 4 V.

Therefore, improved solutions may aim at maintaining the voltage applied to the gate of the high-side transistor HS within a range of values (e.g., 4 V to 6 V). An applied gate voltage above said range may stress the high-side transistor, and an applied gate voltage below said range may reduce the system efficiency. Improved solutions may aim at keeping the gate voltage of the high-side transistor HS below the upper threshold to protect it from electrical stress, while at the same time maintaining said gate voltage as close as possible to the upper threshold so to increase the efficiency.

FIG. 2A is a circuit block diagram exemplary of the bootstrap circuitry of a half-bridge switching circuit as exemplified in FIG. 1, where certain components of the circuit 10 which are not directly related to the bootstrap functionality are not illustrated. As described with reference to FIG. 1, such bootstrap circuitry comprises a bootstrap diode DB coupled between the positive terminal 100a of the DC low voltage supply rail $V_{CC}$ and the floating supply voltage node 104, and a bootstrap capacitance $C_B$ coupled between the floating supply voltage node 104 and the (positive) output terminal 102a. The (positive) output terminal 102a is selectively couplable to the voltage reference node 102b by means of a switch (e.g., the low-side transistor LS) or to the DC high voltage positive rail $V_{BUS}$ (e.g., by means of the high-side transistor HS).

Figure 2B:
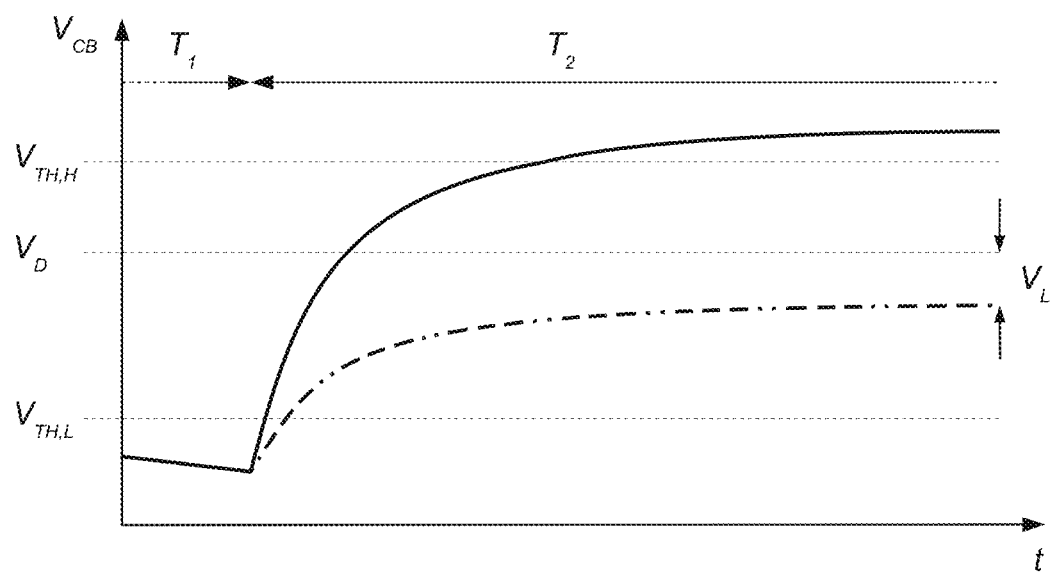
FIGS. 2B, 3B and 4B are exemplary of possible waveforms of signals in circuits as exemplified in FIGS. 2A, 3A and 4A, respectively.

FIG. 2B is exemplary of possible waveforms of the bootstrap voltage $V_{CB}$ across the bootstrap capacitance $C_B$ in the schematic circuit of FIG. 2A, during the supply phase $T_1$ and the recharge phase $T_2$. The voltage $V_{TH,H}$ is exemplary of an upper threshold (e.g., 6 V) for the bootstrap voltage $V_{CB}$, and the voltage $V_{TH,L}$ is exemplary of a lower threshold (e.g., 4 V) for the bootstrap voltage $V_{CB}$. The voltage $V_D$ is exemplary of a desired value of the bootstrap voltage $V_{CB}$, e.g., a value lower than $V_{TH,H}$ but sufficiently close to $V_{TH,H}$ to provide satisfactory efficiency, to be reached during the "recharge" phase of the bootstrap capacitance $C_B$.

It is noted that, depending on the voltage level of the "floating ground" of the floating section FS (i.e., of the output terminal 102a), a circuit as exemplified in FIG. 2A may provide unsatisfactory behavior.

For instance, if the voltage level of the floating ground 102a is (largely) below the voltage level of the reference node GND during the recharge phase $T_2$, the bootstrap voltage $V_{CB}$ may overcome the upper threshold $V_{TH,H}$, as exemplified by the solid line in FIG. 2B. It is noted that the voltage of the floating ground 102a can go below the reference GND as a result of the current of the inductive load recirculating in the low-side power transistor LS, e.g., when the load current outflows from the half-bridge output node 102a and inflows in the source terminal of the low-side power transistor LS from the GND reference. A higher recirculating current may result in a lower voltage at node 102a. It is noted that in the case of a MOS power transistor, the voltage difference between node 102a and the reference GND may be limited by the drain-source diode (also called free-wheel diode) of the low-side power transistor being directly biased and thus keeping the voltage difference in the range of about 1 V to 2 V, depending on the current intensity. In the case of a GaN transistor, where the free-wheel diode is not present, the voltage difference can reach higher values (e.g., in the range of 4 V to 8 V) insofar as the voltage drop may be sustained by the channel of the GaN transistor that is switched on in the reverse direction. The worst case may be represented by the gate of the GaN transistor being biased to the reference node GND and the current flowing into the GaN transistor being at a maximum, e.g., during the half-bridge dead time. In this condition the voltage drop may be determined by the sum of the threshold voltage to switch on the channel, the voltage drop along the channel and the parasitic resistances in series with the power transistor.

On the other hand, if the voltage level of the floating ground 102a is close to or above the voltage level of the reference node GND during the recharge phase $T_2$, the bootstrap voltage $V_{CB}$ may remain (well) below the desired value $V_D$ (e.g., due to the voltage drop $V_L$ across the bootstrap diode DB), as exemplified by the dash-and-dot line in FIG. 2B. The voltage of the floating ground can be around GND when the current in the load is zero. It is noted that the voltage level of the floating ground 102a may increase above the reference GND during the recharge phase $T_2$ as a result of the current of the inductive load flowing into the half-bridge output pin 102a and inside the low-side power transistor LS from the drain terminal to the GND reference.

For example, the above condition may take place when the low-side power transistor LS is on and the voltage difference between nodes 102a and GND is determined by the on-resistance of the low-side power transistors LS multiplied by the current flowing in the low-side power transistor.

For example, the above condition may happen in applications where the second terminal of the inductive load L (which, in the presently considered examples, is coupled to the node 102b by way of example only) can be connected to voltage $V_{BUS}$. This may be the case when two half-bridge circuits are used in a full bridge configuration to drive the stator's inductance of a brushless DC electric motor.

Solutions exist (e.g., according to documents such as U.S. Pat. No. 8,593,211 B2) which aim at preventing the bootstrap voltage $V_{CB}$ from overcoming the upper threshold $V_{TH,H}$ during the bootstrap recharge phase $T_2$.

Figure 3A:
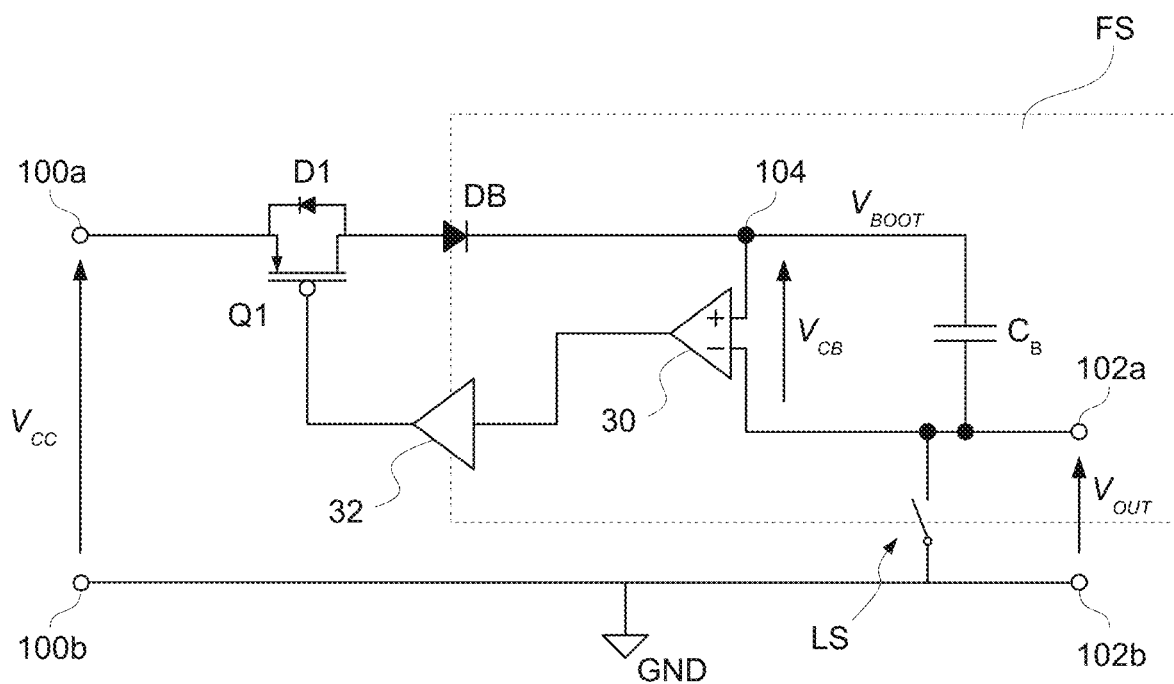

This may be facilitated, for instance, by providing a current limiter circuit coupled in series to the bootstrap diode DB in the low voltage section of the half-bridge switching circuit, as exemplified in FIG. 3A.

The current limiter circuit may comprise a MOS transistor Q1 (e.g., a p-type transistor, having a respective drain-body diode D1) coupled between the node 100a and the anode of the bootstrap diode DB. The current limiter circuit may comprise a voltage sensing circuit 30 and a level shifter circuit 32 configured to sense the bootstrap voltage $V_{CB}$ and transfer a control signal from the floating section FS to the control (gate) terminal of the MOS transistor Q1 in the low voltage section.

Figure 3B:
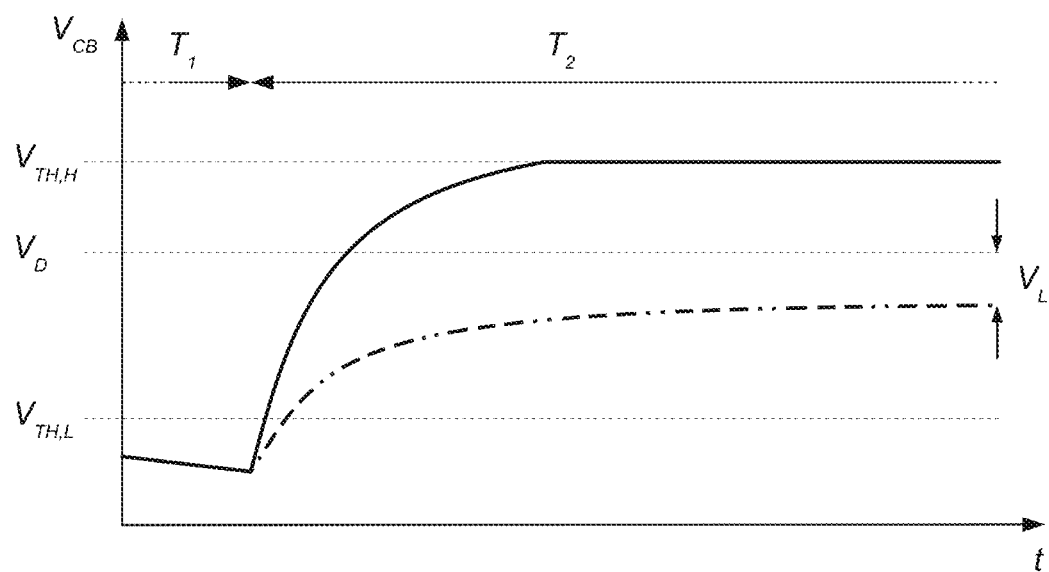

In a circuit as exemplified in FIG. 3A, the current limiter circuit may be configured to counter the current flow through the bootstrap diode DB in response to the bootstrap voltage $V_{CB}$ reaching the upper threshold $V_{TH,H}$. Therefore, the bootstrap voltage $V_{CB}$ across the bootstrap capacitance $C_B$ may be limited below the upper threshold $V_{TH,H}$, as exemplified by the solid line in FIG. 3B. However, a circuit as exemplified in FIG. 3A may not be able to reduce the voltage loss $V_L$ due to the threshold of the bootstrap diode DB, as exemplified by the dash-and-dot line in FIG. 3B.

Other solutions exist (e.g., according to documents such as U.S. Pat. No. 7,215,189 B2, U.S. Pat. No. 7,456,658 B2, or U.S. Pat. No. 7,538,583 B2) which aim at reducing the voltage drop $V_L$ due to the threshold of the bootstrap diode DB.

Figure 4A:
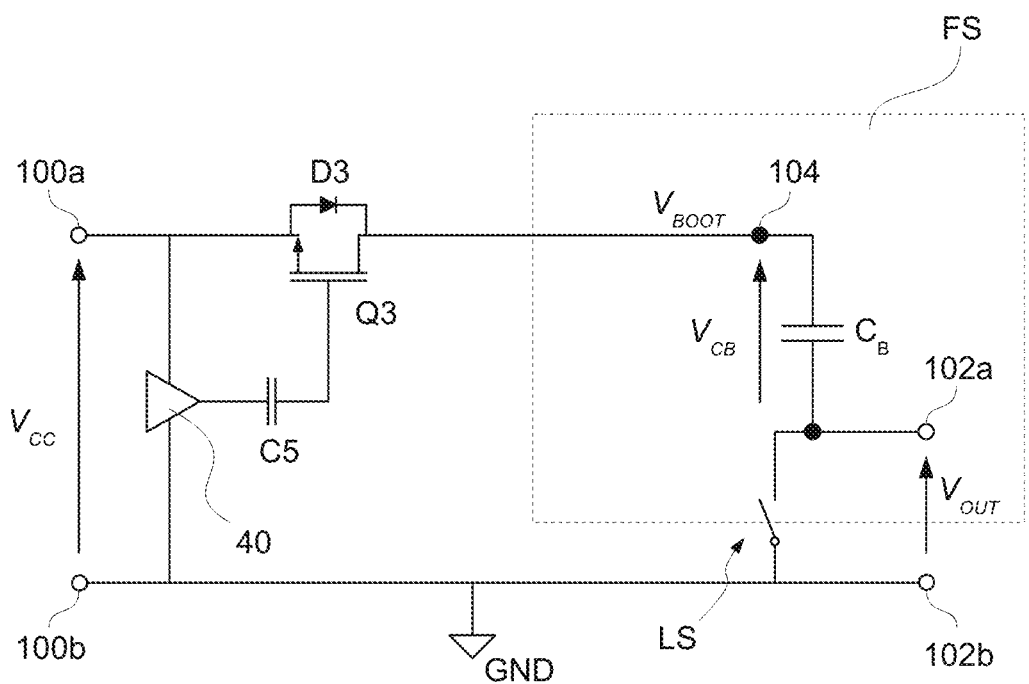

This may be facilitated, for instance, by replacing the bootstrap diode DB with an active diode circuit in the low voltage section of the half-bridge switching circuit, as exemplified in FIG. 4A.

The active diode circuit may comprise a MOS transistor Q3 (e.g., an n-type transistor, having a respective drain-body diode D3) coupled between the node 100a and the floating supply voltage node 104. The active diode circuit may comprise a respective driver circuit 40 powered by the low voltage supply rail $V_{CC}$ and coupled to the control (gate) terminal of the MOS transistor Q3 via a capacitive component C5, e.g., a capacitor.

Figure 4B:
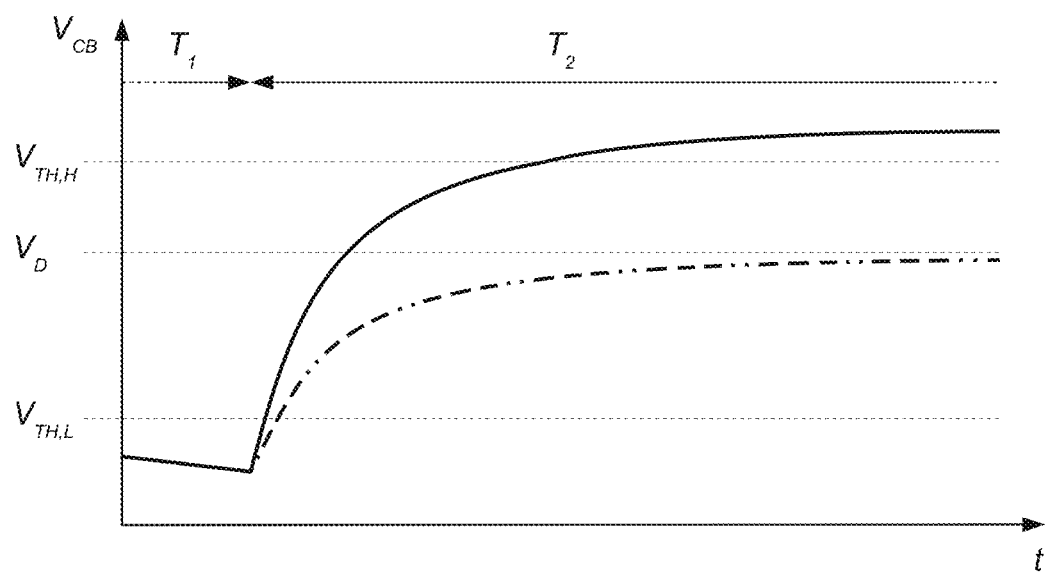

In a circuit as exemplified in FIG. 4A, the active diode circuit may be configured to reduce the voltage drop between the supply node 100a and the floating supply voltage node 104 during the bootstrap recharge phase $T_2$. Therefore, the bootstrap voltage $V_{CB}$ across the bootstrap capacitance $C_B$ may approach (or reach) the desired value $V_D$, as exemplified by the dash-and-dot line in FIG. 4B. However, a circuit as exemplified in FIG. 4A may not be able to limit the bootstrap voltage $V_{CB}$ below the upper threshold $V_{TH,H}$, as exemplified by the solid line in FIG. 4B.

Figure 5A:
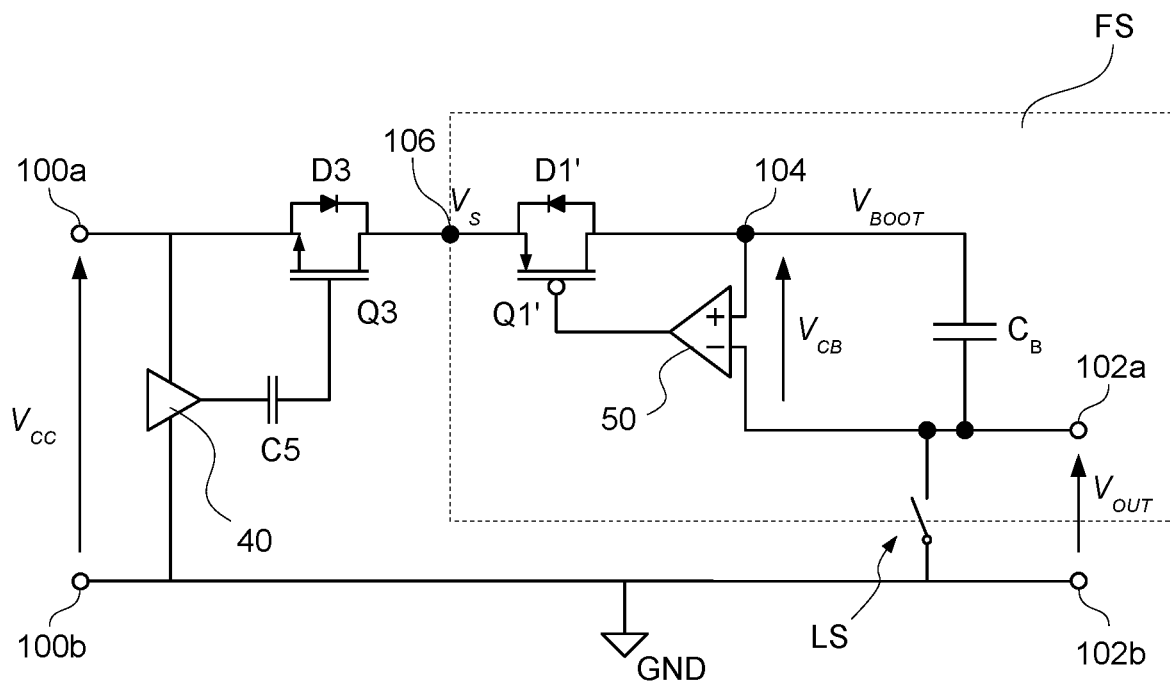
FIG. 5A is a circuit block diagram exemplary of a bootstrap architecture for a half-bridge switching circuit according to one or more embodiments.
Figure 6:
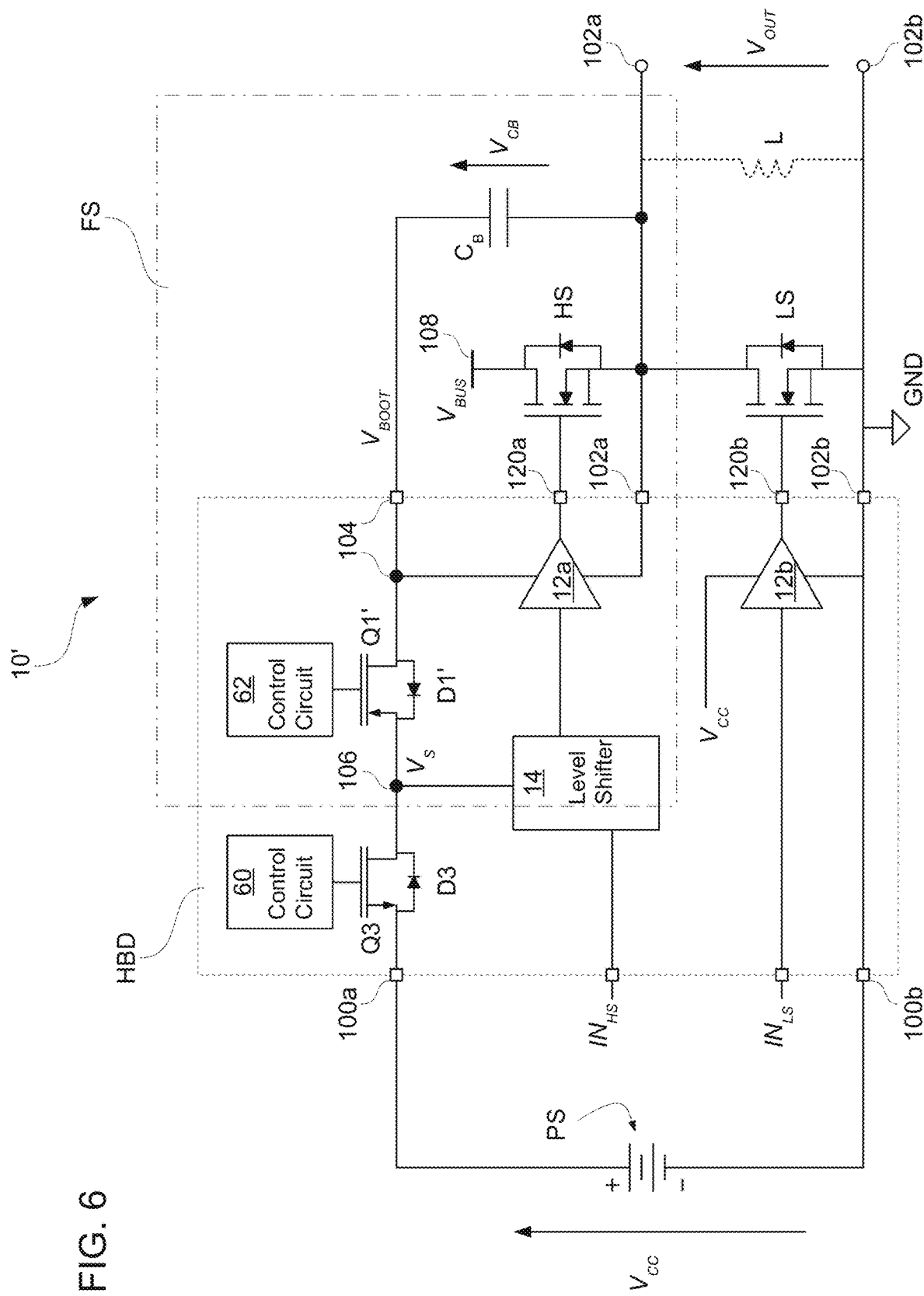
FIG. 6 is a circuit block diagram exemplary of a half-bridge switching circuit and related driving circuitry including a high-side bootstrap architecture according to one or more embodiments.

Therefore, one or more embodiments may relate to a half-bridge switching circuit 10' comprising high-side bootstrap circuitry as exemplified in FIGS. 5A and 6.

One or more embodiments are primarily related with a driver circuit HBD for a half bridge circuit. It will be otherwise appreciated that, while intended to co-operate with such a half bridge circuit, a drive circuit according to one or more embodiments may be implemented as a distinct element from the half-bridge circuit driven thereby.

As exemplified in FIG. 5A, one or more embodiments may comprise a current limiter circuit implemented (completely) in the floating section FS of the half-bridge switching circuit 10', between a bootstrap diode and the floating supply voltage node 104, with related control circuitry. For instance, the current limiter circuit may comprise a MOS transistor Q1' (e.g., a p-type transistor, having a respective drain-body diode D1') coupled between the cathode of the bootstrap diode (indicated as node 106 in FIGS. 5A and 6) and the floating supply voltage node 104, and a voltage sensing circuit 50 configured to sense the bootstrap voltage $V_{CB}$ and transfer a corresponding control signal to the control (gate) terminal of the MOS transistor Q1'.

In one or more embodiments, the bootstrap diode may be a diode or, optionally, an active diode circuit, as exemplified in FIGS. 5A and 6.

Figure 5B:
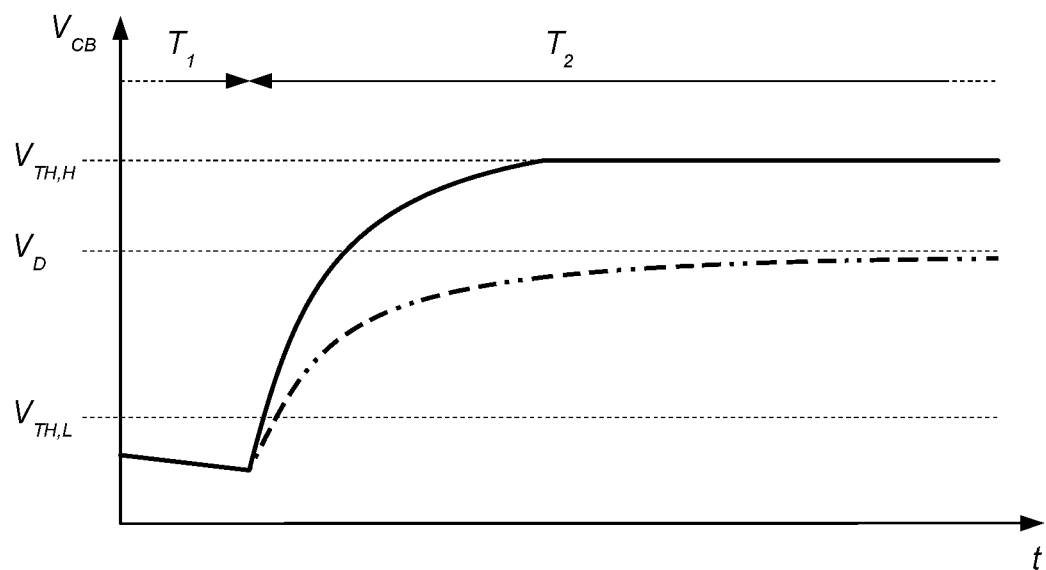
FIG. 5B is exemplary of possible waveforms of signals in one or more embodiments as exemplified in FIGS. 5A.

In a circuit as exemplified in FIGS. 5A and 6, the bootstrap voltage $V_{CB}$ may be limited below the upper threshold $V_{TH,H}$, as exemplified by the solid line in FIG. 5B, and may approach (or reach) the desired value $V_D$, as exemplified by the dash-and-dot line in FIG. 5B, depending on the voltage level of the floating ground of the floating section FS (i.e., of the output terminal 102a).

FIG. 6 is exemplary, in particular, of one or more embodiments of a half-bridge switching circuit 10' comprising an active diode circuit (e.g., comprising a transistor Q3 having a drain-body diode D3) and its respective control circuit 60, and a current limiter circuit (e.g., comprising a transistor Q1' having a drain-body diode D1') implemented in the floating section FS together with its respective control circuit 62. Therefore, the control circuit 62 may be supplied and driven in the floating section FS of the half-bridge driving circuit HBD so as to drive as desired the gate-source voltage of the transistor Q1'.

As exemplified in FIG. 7 and explained below, the control circuit 62 may be connected and supplied by nodes 106 and 104 that act as positive supply nodes to facilitate correct operation of the control circuit 62. Node 102a acts as a reference or negative supply node for circuit 62.

As previously discussed, and now with reference to FIG. 6, it is noted that the switching operation of the half-bridge circuit HS, LS also results in a bootstrap recharge phase (during which HS is off and LS is on) and a bootstrap supply phase (during which HS is on and LS is off).

During the recharge phase, the voltage $V_{BOOT}$ at the floating supply voltage node 104 may be below $V_{CC}$ and the current flowing through the bootstrap diode (e.g., Q3, D3) and the current limiter (e.g., Q1') may charge the bootstrap capacitance $C_B$ (which may comprise a capacitor mounted externally to the circuit 10'). The value reached by the bootstrap voltage $V_{CB}$ during the recharge phase may depend on the amount of current flowing into the low-side transistor LS during the recharge phase.

As previously discussed, the following situations may possibly arise:

i) in case of negligible current recirculation on the low-side transistor LS, the bootstrap voltage $V_{CB}$ may rise poorly; as a result, the bootstrap diode (e.g., an active diode Q3, D3) may be switched on (e.g., by the respective control circuit 60) to increase the current flow, thereby facilitating a higher final value of the bootstrap voltage $V_{CB}$ at the end of the recharge phase $T_2$; and ii) in case of current recirculation on the low-side transistor LS (in particular, at high currents), the bootstrap voltage $V_{CB}$ may rise to a voltage level (much) higher than $V_{CC}$ and may thus overcome the upper threshold $V_{TH,H}$ (e.g., equal to 6 V); therefore, as a result of the bootstrap voltage $V_{CB}$ reaching a desired value $V_D$ (e.g., equal to 5.4 V), a voltage sensing circuit in the control circuit 62 may transmit a control signal to a logic circuit in order to switch off the current limiter circuit (e.g., the transistor Q1') to avoid further charging the bootstrap capacitance $C_B$.

In the scenario (ii) above, when the voltage drop due to recirculating currents is so high to pull the voltage $V_{BOOT}$ at the floating supply node 104 down to a voltage near or below the reference voltage GND (e.g., during dead time), a circuit according to one or more embodiments as exemplified in FIG. 6 may advantageously provide at the node 106 a supply voltage $V_S$ for the level shifter circuit 14, thereby facilitating operation of the level shifter circuit 14 independently from the voltage at the floating supply voltage node 104.

As exemplified in FIGS. 5A and 6, providing a current limiter transistor Q1' in the floating section FS provides a new node 106 in the bootstrap path between node 100a and node 104. The current limiter transistor Q1' may have a respective drain-body diode D1'. In order to counter a current flow from node 100a to node 104 when $V_{BOOT} < V_{CC}$, the drain-body diode D1' is arranged "back to back" with the bootstrap diode (BD or D3), allowing a current flow from node 104 to node 106 (and not vice-versa).

Therefore, in one or more embodiments the node 106 may be arranged intermediate two back to back diodes, so that its voltage may be limited (e.g., by design) to a value higher than or equal to the maximum between $V_{CC}$ and $V_{BOOT}$, minus the voltage drop allowed by one diode.

It is noted that a combination of the two properties described above, that is (i) the capability of stopping the current flow from $V_{CC}$ (e.g., node 100a) to the floating side (e.g., node 104) even when the voltage $V_{BOOT}$ (e.g., at node 104) is below the voltage of the reference node GND, and the (ii) capability of transferring the switching signal (e.g., $IN_{HS}$) from the low voltage side to the floating side FS of the half-bridge even when the voltage $V_{BOOT}$ (e.g., at node 104) is below the voltage of the reference node GND, results in the capability of correctly switching the half-bridge circuit even when the floating supply node 104 (e.g., voltage $V_{BOOT}$) is biased well below the reference or ground level (e.g., even few tens of volts) for a large percentage of the duty cycle, as a common working mode, without increasing power dissipation inside the half-bridge driving integrated circuit HBD. The maximum achievable negative voltage of the floating supply node 104 (e.g., voltage $V_{BOOT}$) is related (only) to the maximum voltage drop that the transistor Q1' can sustain when it is in the OFF condition.

Figure 7:
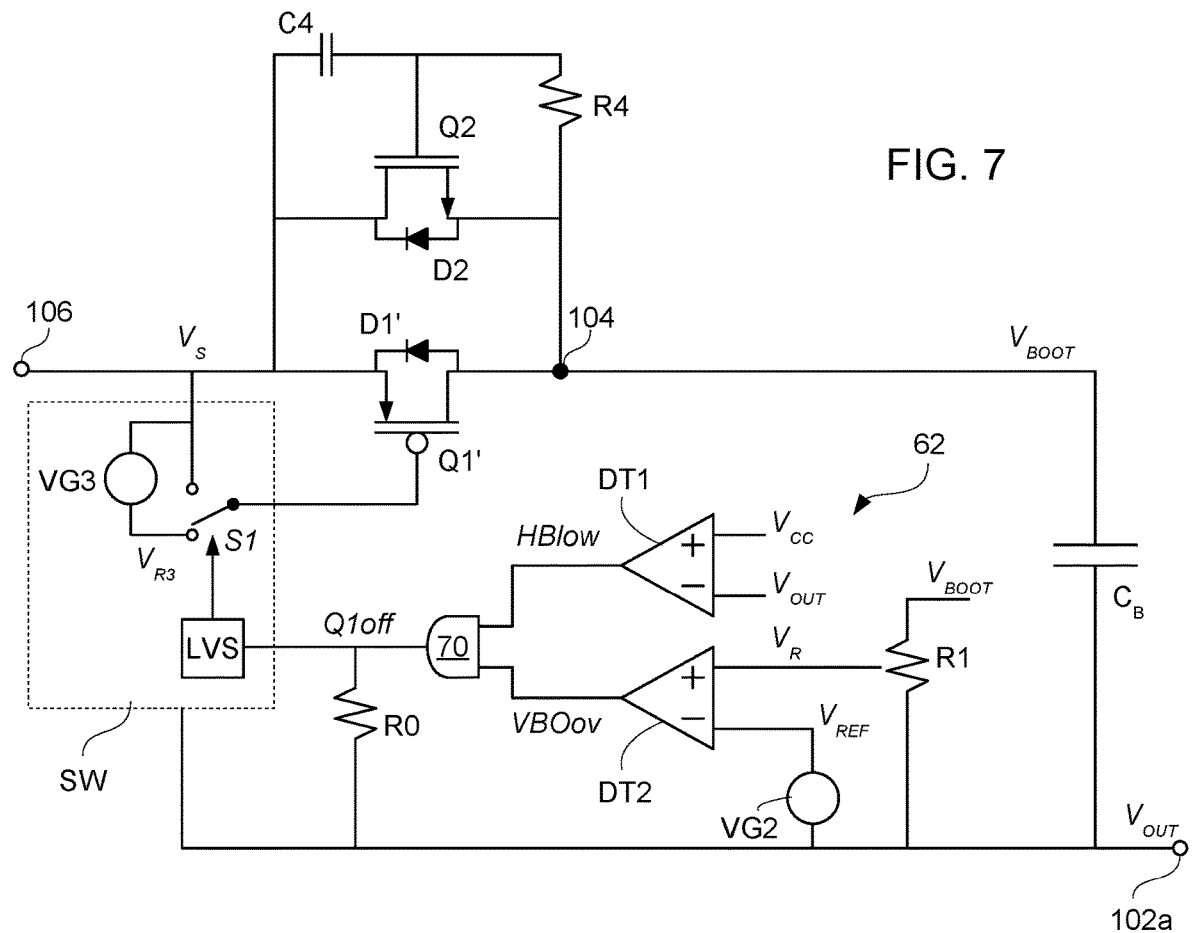
FIG. 7 is a circuit block diagram exemplary of implementation details of one or more embodiments.

FIG. 7 is a circuit block diagram exemplary of a possible implementation of a current limiter circuit and related control circuitry in one or more embodiments.

It will be understood that, while such a current limiter circuit may be advantageously used in combination with an active bootstrap diode in one or more embodiments (and thus, reference to such an active diode will be made in the following), certain embodiments may relate to such a current limiter circuit used in combination with a conventional passive bootstrap diode BD.

As exemplified in FIG. 7, one or more embodiments may comprise a current limiter transistor Q1' coupled between nodes 106 and 104 and having a respective drain-body diode D1'. In order to have the drain-body diode D1' arranged in the desired direction (i.e., having the cathode coupled to node 106 and the anode coupled to node 104), the current limiter transistor Q1' may comprise a P-channel high-voltage MOS transistor having the source terminal and the body terminal connected to node 106. In this exemplary case, the gate-source voltage which drives the transistor Q1' to switch the channel on and off may be lower than $V_S$.

Alternatively, the current limiter transistor may comprise an N-channel high-voltage MOS transistor having the source terminal connected to node 104. In this exemplary case, the gate-source voltage which drives such transistor to switch the channel on and off may be higher than $V_{BOOT}$ and may be generated by a circuit such as a charge pump circuit, not visible in the Figures annexed herein.

In one or more embodiments, the voltage at node 104 may switch from a low value (e.g., around $V_{CC}$) to a high value (e.g., much higher than $V_{CC}$) and then back to the low value at a very high speed. For instance, the variation of voltage $V_{BOOT}$ at node 104 over a time interval may exceed 100 V/ns (1 ns=$10^{-9}$ s), as exemplified in FIG. 8.

Figure 8:
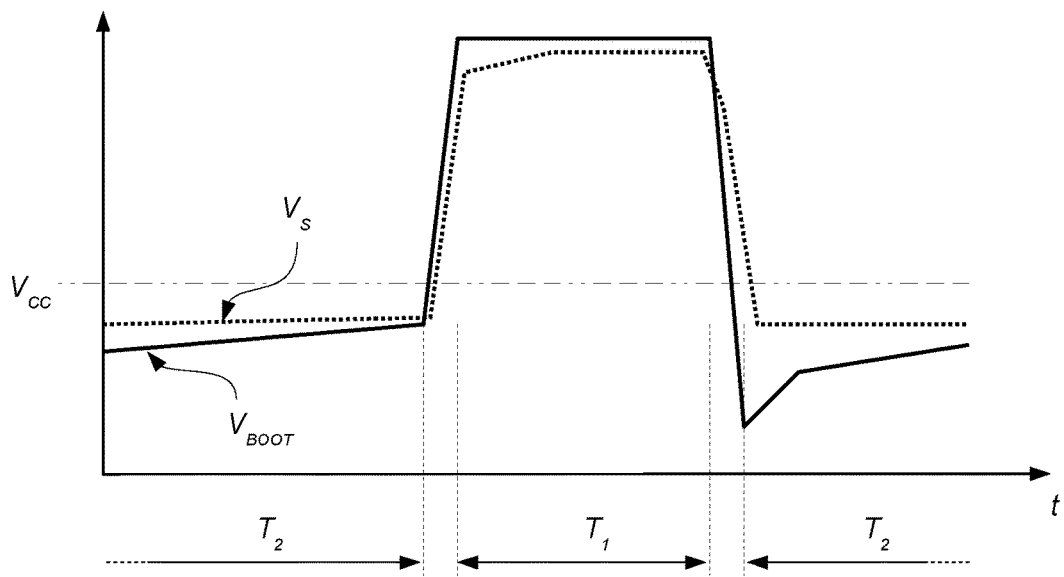
FIG. 8 is exemplary of possible waveforms of signals in one or more embodiments.

As exemplified in FIG. 8, as a result of the voltage $V_{BOOT}$ switching to a high value (entering the "bootstrap supply phase" $T_1$), the node 106 may be pulled up to a voltage (almost) equal to $V_{BOOT}$ by the current flowing in the drain-body diode D1' of the current limiter transistor Q1', as it is forward biased. This current may charge the parasitic capacitances between the node 106 and the low voltage nodes. In particular, this current may charge a parasitic capacitance C3 at the cathode of the active diode Q3 (see FIG. 9).

During the "bootstrap supply phase" $T_1$, while the voltage $V_{BOOT}$ is in the high-voltage range, the node 106 may be still pulled up by the drain-body diode D1' of the current limiter transistor. The current limiter transistor Q1' may be set ON in order to reduce the voltage drop between node 106 and node 104, and in order to be ON at the beginning of the falling phase, e.g., when entering the "bootstrap recharge phase" $T_2$.

As a result of the voltage $V_{BOOT}$ switching back to a low value (entering the "bootstrap recharge phase" $T_2$), the drain-body diodes D3 and D1' of the active diode circuit and of the current limiter circuit may be both in reverse bias, and the node 106 may remain floating at high voltage with the risk of overcoming a breakdown voltage of the circuitry connected between node 106 and nodes 104, 102a.

In order to counter such overvoltage events, the node 106 may be discharged towards node 104 with a current sufficient to limit the voltage difference between nodes 106 and 104 within the circuitry breakdown voltage. Therefore, node 106 may be discharged by keeping ON the current limiter transistor Q1', thereby providing a conductive current path between node 106 and node 104.

It is noted that even if the current limiter transistor Q1' remains ON during the falling phase of the voltage $V_{BOOT}$ at node 104, its conductivity may be not be sufficient to allow peak currents high enough to discharge the node 106 at a sufficient speed (e.g., considering worst case conditions), that is with very fast falling rates.

Therefore, one or more embodiments may optionally comprise a "fast discharge" transistor Q2 connected in parallel to the current limiter transistor Q1' as exemplified in FIG. 7, and related circuitry. For instance, the fast discharge transistor may comprise an N-channel MOS transistor Q2 having a source terminal coupled to node 104 and a drain terminal coupled to node 106. The fast discharge transistor Q2 may comprise a respective drain-body diode D2 parallel to diode D1'. The related circuitry may comprise a resistive component R4 (e.g., a resistor) coupled between the source and the gate of transistor Q2, and a capacitive component C4 (e.g., a capacitor) coupled between the drain and the gate of transistor Q2.

The fast discharge circuitry Q2, R4, C4 may facilitate sinking current from the parasitic capacitance at node 106 to discharge node 106 at a higher speed (e.g., up to a rate of 200 V/ns). The transistor Q2 may be normally OFF insofar as the resistance R4, having no current flowing inside, keeps the gate-source voltage of transistor Q2 close to 0 V. As a result of the voltage $V_{BOOT}$ at node 104 falling rapidly (e.g., with a fast or sharp edge) versus the voltage $V_S$ at node 106, the capacitance C4 may provide a current path for a current to flow into the resistance R4, thereby switching ON the channel of transistor Q2. This may provide an additional current path in parallel to transistor Q1', which facilitates keeping the voltage difference between node 106 and node 104 within a threshold. The fast discharge transistor Q2 may turn OFF until the next falling edge of voltage $V_{BOOT}$ after a (short) time interval. The duration of such time interval may be tuned as a function of the values of the resistance R4 and of the capacitance C4. Purely by way of non-limiting example, the resistance R4 may have a value of approximately 300 Ω, the capacitance C4 may have a value of approximately 10 pF (1 pF=$10^{-12}$ F) so that the time interval may have a value of approximately 3 ns (1 ns=$10^{-9}$ s).

At the end of the falling phase of voltage $V_{BOOT}$, the voltage at node 104 may decrease below $V_{CC}$ and the active diode Q3 may start charging the bootstrap capacitance $C_B$. The fast discharge current path may be quickly opened as a result of the resistance R4 discharging the gate-source capacitance of transistor Q2, and the ON/OFF status of the current limiter transistor Q1' may be controlled to avoid overcharging the bootstrap capacitance $C_B$.

While the voltage $V_{BOOT}$ at node 104 is below $V_{CC}$, the voltage $V_{CB}$ across the bootstrap capacitance $C_B$ may increase and one or more embodiments as exemplified herein may provide improved control of the voltage $V_{CB}$ at the end of the charging phase $T_2$, as previously discussed. For instance, an active diode Q3 may reduce the voltage drop between node 100a and node 104 to increase the amount of charge storable in the bootstrap capacitance $C_B$, while the current limiter transistor Q1' may prevent further charging the bootstrap capacitance $C_B$ as a result of the corresponding bootstrap voltage $V_{CB}$ reaching a threshold value.

As exemplified in FIG. 7, the driving circuitry that drives the current limiter transistor Q1' may comprise a detector circuit DT1 (e.g., a comparator circuit) configured to compare the voltage $V_{CC}$ to the voltage $V_{OUT}$ (e.g., by receiving the voltage $V_{CC}$ at a positive input and the voltage $V_{OUT}$ at a negative input). When the voltage $V_{OUT}$ is higher than the voltage $V_{CC}$, the half-bridge circuit is considered to be in the high state, the signal HBlow at the output of the detector circuit DT1 is low, and the current limiter transistor Q1' is switched ON. As previously discussed, this condition may be kept for the rising phase, the high phase and the falling phase of the voltage $V_{BOOT}$. When the voltage $V_{BOOT}$ at node 104 is low, the voltage $V_{OUT}$ is lower than $V_{CC}$, the signal HBlow is high and the status of the current limiter transistor Q1' may be controlled by the signal VBOov provided at the output of another detector circuit DT2 (e.g., a comparator circuit). The detector circuit DT2 may be configured to compare a reference voltage $V_{REF}$ (e.g., referred to voltage $V_{OUT}$) to a signal $V_R$ generated as a function of the voltages $V_{BOOT}$ and $V_{OUT}$. For instance, the signal $V_{REF}$ may be generated by a circuit VG2 that behaves as a voltage generator, coupled to node 102a. For instance, the signal $V_R$ may be generated as a partition of the voltage difference $V_{BOOT}-V_{OUT}$, e.g., via a resistive voltage divider R1. As a result of the voltage difference $V_R$ being higher than the reference voltage $V_{REF}$, the signal VBOov may switch to a high state, the signal Q1off may rise to a high state and the current limiter transistor Q1' may be switched OFF to prevent a further increase of the voltage $V_{CB}$ across the bootstrap capacitance $C_B$.

As exemplified in FIG. 7, the logic signal 1loff may be generated at the output of an AND gate 70 receiving as inputs the logic signals HBlow and VBOov. Table I annexed at the end of the description summarizes the logic that drives the current limiter transistor Q1' according to the presently considered example. Symbol "X" in the "Inputs" columns indicates a "don't care" condition.

In one or more embodiments as exemplified herein, the voltage $V_S$ at node 106 may be higher than the voltage $V_{BOOT}$ at node 104 during the falling phase of $V_{BOOT}$, as previously discussed, and in case the voltage at node 104 decreased (deeply) below voltage $V_{CC}$. Therefore, one or more embodiments as exemplified in FIG. 7 may comprise a circuit SW configured to translate the logic signal Q1off to the appropriate voltage level to drive the gate-source voltage of the current limiter transistor Q1'.

Therefore, in one or more embodiments a level shifter circuit LVS may be used to propagate the logic signal Q1off from the floating supply domain (between $V_{BOOT}$ and $V_{OUT}$) to the supply domain of node 106 to drive a switch S1. The switch S1 can selectively connect the gate terminal of transistor Q1' to the source terminal of transistor Q1' (i.e., to node 106) or to a further node providing a voltage $V_{R3}$. As exemplified in FIG. 7, the voltage $V_{R3}$ may be generated by a circuit VG3 that behaves as a voltage generator and provides to that further node a voltage $V_{R3}$ lower than $V_S$ and suitable to switch ON the current limiter transistor Q1'.

In one or more embodiments, a value of the voltage $V_{CB}$ close to 0 V (as it may happen, for instance, at the power-up of the device) may represent a critical condition, insofar as in such a case the logic value of the signal Q1off can be invalid and the current limiter transistor Q1' may remain OFF if not properly driven, preventing the bootstrap capacitance $C_B$ from charging and thus keeping the voltage $V_{CB}$ stuck to 0 V.

Therefore, one or more embodiments may optionally comprise a resistive connection R0 between the propagation path of signal Q1off and the node 102a, which may advantageously keep the signal Q1off to a low value in the condition discussed above. The resistance of the resistive path R0 may be selected to be high so as to limit the static power consumption. By way of example, the resistance R0 may be around 30 kΩ. Considering an internal supply voltage of the logic circuit of 3.3 V, the static consumption when the node Q1off is high can thus be limited to around 10 μA. In one or more embodiments, the internal supply voltage of the logic circuit this detail may be different, and the value of R0 may be selected accordingly.

It is noted that after power-up of the device, at the first charging event of the bootstrap capacitance $C_B$ that starts with $V_{CB}$~0 V, the node 102a may be shorted to the reference node GND (e.g., ground) by switching ON the low-side transistor LS. The circuit SW may thus be supplied between the voltage $V_S$ at node 106 (which may be, e.g., lower than $V_{CC}$ by approximately on diode threshold drop) and the voltage $V_{OUT}$ (which may be, e.g., approximately equal to the reference voltage of node GND). Therefore, the circuit SW may have enough overdrive to generate the voltage $V_{R3}$ and propagate the signal Q1off to the switch S1, with the result of turning ON the current limiter transistor Q1' and letting a current flow through the active diode Q3 to charge the bootstrap capacitance $C_B$. This condition is exemplified, for instance, in the last row of Table I.

Figure 9:
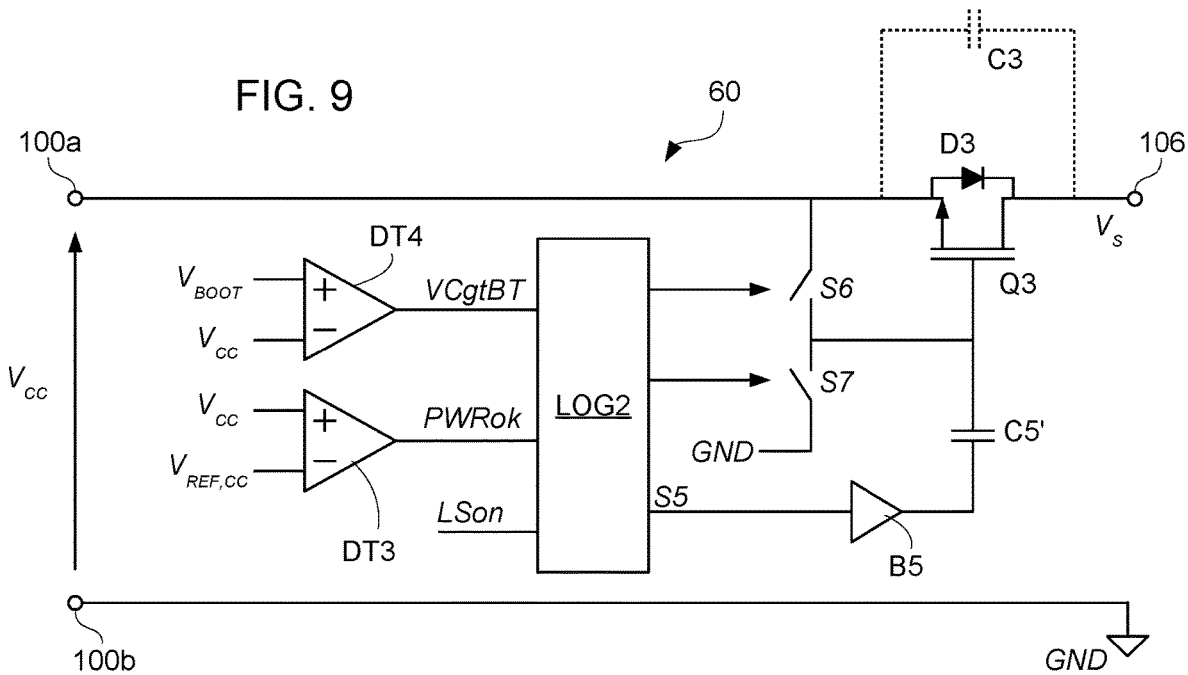
FIG. 9 is a circuit block diagram exemplary of implementation details of one or more embodiments.

FIG. 9 is a circuit block diagram exemplary of a possible implementation of an active diode circuit and related control circuitry in one or more embodiments.

As exemplified in FIG. 9, an active diode circuit may comprise a transistor Q3 (e.g., a large high voltage N-channel transistor) whose drain-body diode D3 operates as a conventional bootstrap diode, being the body of transistor Q3 shorted to the respective source terminal, and the source terminal being coupled to node 100a. The channel of transistor Q3 can be switched ON to increase the current flowing from node 100a to node 104 (via node 106), when the voltage drop between the anode and the cathode of the drain-body diode D3 is reaching the diode threshold voltage. The bootstrap capacitance $C_B$ can thus be charged to a higher voltage $V_{CB}$ compared to other solutions implementing a passive bootstrap diode DB (see, for instance, FIG. 3A).

In one or more embodiments, the voltage at the gate terminal of the (N-channel) transistor Q3 may be brought to a level higher than the voltage at the source terminal, which is connected to $V_{CC}$, to switch on the channel of transistor Q3. Therefore, a boosting circuit may be used to drive the gate terminal of transistor Q3. As exemplified in FIG. 9, the boosting circuit may comprise a boosting capacitance C5 driven by a driver circuit B5 controlled by a control signal S5 generated by a logic circuit LOG2.

In one or more embodiments, the gate terminal of the (N-channel) transistor Q3 may be connected to $V_{CC}$ (e.g., to node 100a) to switch off the channel of transistor Q3. As a result of the voltages $V_{BOOT}$ and $V_S$ at nodes 104, 106 rising rapidly to the high voltage value $V_{CC}+V_{BUS}$, the drain-gate capacitance of transistor Q3 may increase the gate voltage and turn on the transistor Q3. Hence, transistor Q3 may be switched off by activating a low resistance switch S6 which couples the gate terminal of transistor Q3 to the node 100a at voltage $V_{CC}$. The switch S6 may be driven by a control signal generated by the logic circuit LOG2.

In one or more embodiments, if $V_{CC}$ is lower than a threshold value (e.g., 2 V measured with respect to the reference voltage of node GND), the logic circuit LOG2 may not be able to provide a sufficient drive capability to properly activate the switch S6, and the path that couples the gate terminal of transistor Q3 to node 100a may exhibit a high resistance. Hence, the channel of transistor Q3 may switch on in case the voltages at nodes 104 and 106 rise at high speed, when $V_{CC}$ is less than a threshold value (e.g., 2 V), allowing an undesired flow of current from node 104 to node 100a. Therefore, one or more embodiments may comprise a detector circuit DT3 configured to detect whether the supply voltage $V_{CC}$ is below a threshold value $V_{REF,CC}$ (e.g., around 2.5 V above GND) by comparing $V_{CC}$ to a voltage reference $V_{REF,CC}$ and generating a corresponding output signal PWRok. As a result of the signal PWRok being low (e.g., indicating that the supply voltage $V_{CC}$ is below a thresholds value $V_{REF,CC}$), a further switch S7 may be activated to pull-down the gate terminal of the transistor Q3 below the voltage $V_{CC}$ (e.g., by coupling the gate terminal of transistor Q3 to the ground level GND) in order to produce a negative gate-source voltage of the transistor Q3 and (hardly) switch off its channel.

In one or more embodiments, as a result of the supply voltage $V_{CC}$ being in the correct working range (e.g., higher than $V_{REF,CC}$), the signal PWRok may be high and the conductivity of the channel of the transistor Q3 may be controlled as a function of two control signals LSon and VCgtBT. The control signal LSon may correspond to the low-side control signal $IN_{LS}$ of the half-bridge circuit. The control signal VCgtBT may be generated at the output of a detector circuit DT4 configured to compare the voltage $V_{BOOT}$ to the voltage $V_{CC}$. For instance, the control signal VCgtBT being low may indicate that the voltage $V_{CC}$ is higher than the voltage $V_{BOOT}$.

Table II summarizes the values of input signals and output signals of the logic circuit LOG2, and the corresponding status of the transistor Q3, according to the presently considered example. Symbol "X" in the "Inputs" columns indicates a "don't care" condition.

In one or more embodiments, the transistor Q3 may be switched off in response to the voltage $V_{BOOT}$ increasing above the voltage $V_{CC}$ (e.g., as detected by the detector circuit DT4) in order to behave similarly to a junction bootstrap diode and countering current flow when voltage $V_{BOOT}$ is higher than voltage $V_{CC}$. However, the detector circuit DT4 may have some response delay, and may thus be effective (only) in case of slow variations of the voltage $V_{BOOT}$. The fast rising edges of voltage $V_{BOOT}$ (due to the half-bridge output node switching) are preceded by the de-activation (i.e., switching OFF) of the low-side power transistor LS. Hence, the logic signal LSon, that goes low when the low-side transistor LS is switched off, may be also used to switch off the transistor Q3 just before the commutation of the half-bridge output node.

Figure 10:
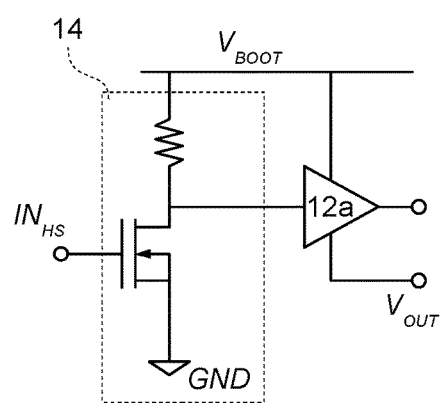
FIG. 10 is a circuit block diagram exemplary of a level shifter circuit.

It is noted that one or more embodiments may advantageously address another issue related to driving of enhancement GaN power transistors. In fact, before switching to the conductive state, both the low-side and the high-side power transistors LS, HS may be kept off for a (short) period of time, called dead time, to avoid cross conduction between the power supplies. During the dead time, if the load current is recirculating inside the low-side power transistor LS, the output node 102a of the half-bridge circuit may assume a voltage well below the reference voltage of node GND (e.g., even 4 V and more below the reference voltage GND), due to the reverse conduction characteristic of enhancement GaN transistors. In this case, even if the bootstrap capacitance $C_B$ is charged to the maximum limit $V_D$ (e.g., 5.4 V), the voltage $V_{BOOT}$ at node 104 may be only about 1 V above the reference voltage of node GND. In this condition, a conventional level shifter 14 as exemplified in FIG. 10 that transfers the logic signal $IN_{HS}$ from a low voltage input buffer to the high voltage floating section FS of the half-bridge circuit may not operate correctly, e.g., because the dynamic range of the level shifter circuit is not extended enough.

As previously discussed, in one or more embodiments the voltage $V_S$ at node 106 may not decrease below $V_{CC}$-1V. A preferred value of the supply voltage $V_{CC}$ to drive enhancement GaN transistors may be around 5 V, and 4 V may be a minimum value. Therefore, the voltage $V_S$ at node 106 may not be lower than 3 V, and the voltage $V_S$ can be used as a supply node of a level shifter driven from the GND supply domain. For similar reason, the voltage drop between nodes 106 and 102a (i.e., between voltage $V_S$ and voltage $V_{OUT}$) may (always) be higher than 3 V.

Figure 11:
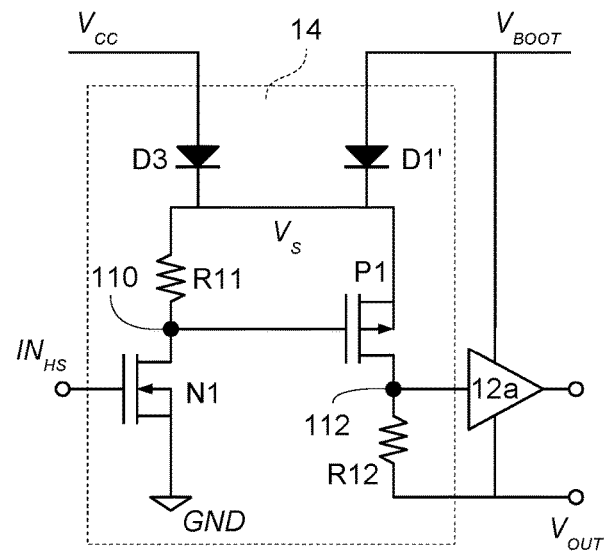
FIG. 11 is a circuit block diagram exemplary of a level shifter circuit according to one or more embodiments.

Therefore, in one or more embodiments a level shifter circuit 14 may comprise two stages as exemplified in FIG. 11. The first stage may be driven between GND and $V_S$, and the second stage may be driven between $V_S$ and $V_{OUT}$.

For instance, the first stage may comprise an n-type transistor N1 configured to receive the input signal $IN_{HS}$ at a respective gate terminal, the transistor N1 having its current path arranged between the reference terminal GND and an intermediate node 110. The first stage may also comprise a resistor R11 arranged between the intermediate node 110 and the node 106 at voltage $V_S$. The second stage may comprise a p-type transistor P1 having a respective gate terminal coupled to the intermediate node 110 of the first stage, the transistor P1 having its current path arranged between the node 106 at voltage $V_S$ and an intermediate node 112. The second stage may also comprise a resistor R12 arranged between the intermediate node 112 and the node 102a at voltage $V_{OUT}$.

A level shifter circuit 14 as exemplified in FIG. 11 may be able to transfer the input logic signal $IN_{HS}$ from the GND voltage domain to the $V_{OUT}$ voltage domain, independently from the value of the voltage $V_{BOOT}$ at node 104 (e.g., above $V_{CC}$, below $V_{CC}$ and even below GND).

It is noted that one or more embodiments may include diodes D3 and D1' which advantageously provide the node 106 for operation of a level shifter circuit 14. Alternatively, the level shifter circuit 14 may stand alone, i.e., it may include the diodes D3 and D1'.

In one or more embodiments, a differential level shifter circuit comprising two instances of the level shifter circuit 14 illustrated in FIG. 11 may be used.

Therefore, as exemplified herein, one or more embodiments of a driver circuit for a half-bridge circuit may comprise a current limiter circuit in the floating section of the system and a bootstrap diode in the low voltage section (optionally, active diode circuit). The two circuits may be driven by respective control circuitry implemented in the respective sections.

Advantageously, one or more embodiments may also provide an internal voltage $V_S$ at node 106 which is always positive, and suitable to supply the level shifter circuit 14 for the high-side transistor HS.

One or more embodiments may be fully integrated in a monolithic chip HBD, e.g., including the active diode circuit, the current limiter circuit and the related driving circuitry. One or more embodiments may be used for driving a variety of different devices, such as active clamp flyback converters, resonant LLC converters, and others.

As exemplified herein, a circuit (e.g., HBD) may include:
- a first input supply node (e.g., 100*a*) and a second input supply node (e.g., 100*b*) configured to receive a first supply voltage (e.g., $V_{CC}$) applied therebetween;
- a first input control node configured to receive a first input control signal (e.g., $IN_{HS}$) and a second input control node configured to receive a second input control signal (e.g., $IN_{LS}$),
- a high-side driver circuit (e.g., 12*a*) configured to be coupled to a high-side switch (e.g., HS) of a half-bridge circuit, the high-side driver circuit configured to receive (e.g., 14) said first input control signal and produce a first output control signal between a first high-side output node (e.g., 120*a*) and a second high-side output node (e.g., 102*a*) for controlling said high-side switch,
- a low-side driver circuit (e.g., 12*b*) configured to be coupled to a low-side switch (e.g., LS) of said half-bridge circuit, the low-side driver circuit configured to receive said second input control signal and produce a second output control signal between a first low-side output node (e.g., 120*b*) and a second low-side output node (e.g., 102*b*) for controlling said low-side switch,
- a floating supply node (e.g., 104) configured to receive a floating supply voltage (e.g., $V_{CB}$, $C_B$) applied between said floating supply node and said second high-side output node, wherein the high-side driver circuit is electrically coupled between said floating supply node and said second high-side output node to receive said floating supply voltage,
- a bootstrap diode (e.g., D3) having an anode coupled to said first input supply node and a cathode coupled to an intermediate supply node (e.g., 106), and
- a current limiter circuit (e.g., Q1', D1', 62) coupled between said intermediate supply node and said floating supply node.

As exemplified herein, the current limiter circuit may be configured to sense (e.g., 50) said floating supply voltage and to counter a current flow from said intermediate supply node to said floating supply node as a result of said floating supply voltage reaching a threshold value (e.g., approximately equal to 5.4 V).

As exemplified herein, the current limiter circuit may include a first field-effect transistor (e.g., Q1') having a respective first drain-body diode (e.g., D1'), the respective first drain-body diode having an anode coupled to said floating supply node and a cathode coupled to said intermediate supply node.

As exemplified herein, the current limiter circuit may include:
- a second field-effect transistor (e.g., Q2) having a respective second drain-body diode (e.g., D2), the respective second drain-body diode having an anode coupled to said floating supply node and a cathode coupled to said intermediate supply node,
- a capacitance (e.g., C4) coupled between said intermediate supply node and a gate terminal of said second field-effect transistor, and
- a resistance (e.g., R4) coupled between said floating supply node and said gate terminal of said second field-effect transistor.

As exemplified herein, the current limiter circuit may comprise a status comparator circuit (e.g., DT1) configured to compare said first supply voltage to a switching voltage (e.g., $V_{OUT}$) sensed between said second high-side output node and said second low-side output node. The current limiter circuit may be configured to switch to a conductive state said first field-effect transistor in response to said switching voltage being higher than said first supply voltage.

As exemplified herein, the current limiter circuit may comprise an overvoltage comparator circuit (e.g., DT2) configured to compare a signal (e.g., $V_R$) indicative of said floating supply voltage to a reference signal (e.g., $V_{REF}$). The current limiter circuit may be configured to switch to a non-conductive state said first field-effect transistor in response to said signal indicative of said floating supply voltage being higher than said reference signal.

As exemplified herein, the current limiter circuit may comprise a logic gate (e.g., 70) configured to generate an output logic signal (e.g., Q1off) as a function of an output signal (e.g., HBlow) from said status comparator circuit and an output signal (e.g., VBOov) from said overvoltage comparator circuit. The first field-effect transistor may switch to a non-conductive state in response to said output logic signal having a high value and to a conductive state in response to said output logic signal having a low value. The circuit may comprise a resistive current flow path (e.g., R0) between an output node of said logic gate and said second high-side output node.

As exemplified herein, the current limiter circuit may comprise a switch (e.g., S1) configured to selectively couple a gate terminal of said first field-effect transistor either to said intermediate supply node to receive a positive voltage (e.g., $V_S$) or to a further voltage node. The further voltage node may be configured to provide a voltage (e.g., $V_{R3}$) lower than said positive voltage.

As exemplified herein, the bootstrap diode may comprise a bootstrap field-effect transistor (e.g., Q3) having a respective drain-body diode (e.g., D3). The respective drain-body diode may have an anode coupled to said first input supply node and a cathode coupled to said intermediate supply node.

As exemplified herein, the circuit may comprise a supply comparator circuit (e.g., DT3) configured to compare said first supply voltage to a threshold supply voltage (e.g., $V_{REF,CC}$, optionally equal to about 2.5 V), and a logic circuit (e.g., LOG2) configured to switch to a non-conductive state said bootstrap field-effect transistor in response to said first supply voltage being lower than said threshold supply voltage.

As exemplified herein, the circuit may comprise a bootstrap comparator circuit (e.g., DT4) configured to compare a voltage (e.g., $V_{BOOT}$) at said floating supply node (e.g., sensed between said floating supply node and said second input supply node) to said first supply voltage, and a logic circuit configured to switch to a non-conductive state said bootstrap field-effect transistor in response to said voltage at said floating supply node being higher than said first supply voltage.

As exemplified herein, the circuit may comprise a logic circuit sensitive to a control signal (e.g., LSon) indicative of whether said low-side switch is in a conductive state or in a non-conductive state. The logic circuit may be configured to switch to a non-conductive state said bootstrap field-effect transistor in response to said control signal indicating that said low-side switch is in a non-conductive state.

As exemplified herein, the circuit may comprise a level shifter circuit (e.g., 14) configured to propagate said first input control signal from said first input control node to said high-side driver circuit. The level shifter circuit may be electrically powered between said intermediate supply node and said second input supply node.

As exemplified herein, the level shifter circuit may include:
- a first current flow line between said intermediate supply node and said second input supply node, the first current flow line comprising a first transistor (e.g., N1) having a source terminal coupled to said second input supply node and a first resistance (e.g., R11) coupled between a drain terminal (e.g., 110) of the first transistor and said intermediate supply node, the first transistor having a respective control terminal configured to receive said first input control signal, and
- a second current flow line between said intermediate supply node and said second high-side output node, the second current flow line comprising a second transistor (e.g., P1) having a source terminal coupled to said intermediate supply node and a second resistance (e.g., R12) coupled between a drain terminal (e.g., 112) of the second transistor and said second high-side output node, the second transistor having a respective control terminal coupled to the drain terminal of the first transistor.

As exemplified herein, the circuit may further include:
said high-side switch configured to provide a current flow line between a third input supply node (e.g., 108) and the second high-side output node, wherein the third input supply node is configured to receive a second supply voltage (e.g., $V_{BUS}$) higher than said first supply voltage, and
said low-side switch configured to provide a current flow line between the second high-side output node and the second low-side output node.

As exemplified herein, the second high-side output node and the second low-side output node may be configured to provide said switching voltage therebetween.

As exemplified herein, said high-side switch and said low-side switch may comprise gallium nitride power transistors.

As exemplified herein, a device may include:
a circuit according to one or more embodiments,
a bootstrap capacitor (e.g., $C_B$) coupled between said floating supply node and said second high-side output node of said circuit, and
an inductive load (e.g., L) coupled between said second high-side output node and said second low-side output node of said circuit to receive said switching voltage.

As exemplified herein, a method of operating a circuit or a device according to one or more embodiments may include:
receiving a first supply voltage between said first input supply node and said second input supply node,
receiving a first input control signal at said first input control node and a second input control signal at said second input control node;
producing a first output control signal between said first high-side output node and said second high-side output node for controlling a high-side switch of a half-bridge circuit;
producing a second output control signal between said first low-side output node and said second low-side output node for controlling a low-side switch of said half-bridge circuit;
receiving a floating supply voltage applied between said floating supply node and said second high-side output node to power said high-side driver circuit; and
sensing said floating supply voltage and countering a current flow from said intermediate supply node to said floating supply node as a result of said floating supply voltage reaching a threshold value.

TABLE I

|  |  | Inputs |  | Outputs |  | Q1' status |  |
|---|---|---|---|---|---|---|---|
| $V_{out}$ | $V_{CB}$ | Hblow | VBOov | Q1off | S1 | $V_{gs1}$ | Channel |
| $V_{out} > V_{CC}$ |  | 0 | X | 0 | Low | $V_{gs1} < V_{thr}$ | ON |
| $V_{out} < V_{CC}$ | $V_{CB} < V_{TH,H}$ | 1 | 0 | 0 | Low | $V_{gs1} < V_{thr}$ | ON |
|  | $V_{CB} > V_{TH,H}$ | 1 | 1 | 1 | High | $V_{gs1} = 0$ V | OFF |
| $V_{out} =$ GND | $V_{CB} \sim 0$ V | X | X | 0 | Low | $V_{gs1} < V_{thr}$ | ON |

TABLE II

| Inputs |  |  | Outputs |  |  | Q3 status |  |
|---|---|---|---|---|---|---|---|
| PWRok | VCgtBT | LSon | S5 | S6 | S7 | $V_{gs3}$ | Channel |
| 0 | X | X | LOW | OPEN | CLOSED | $V_{gs3} < 0$ V | STRONG OFF |
| 1 | 0 | X | LOW | CLOSED | OPEN | $V_{gs3} = 0$ V | OFF |
| 1 | 1 | 0 | LOW | CLOSED | OPEN | $V_{gs3} = 0$ V | OFF |
| 1 | 1 | 1 | HIGH | OPEN | OPEN | $V_{gs3} > V_{thr}$ | ON |

A circuit (HBD), may be summarized as including a first input supply node (100a) and a second input supply node (100b) configured to receive a first supply voltage ($V_{CC}$) applied therebetween, a first input control node configured to receive a first input control signal ($IN_{HS}$) and a second input control node configured to receive a second input control signal ($IN_{LS}$), a high-side driver circuit (12a) configured to be coupled to a high-side switch (HS) of a half-bridge circuit, the high-side driver circuit (12a) configured to receive (14) said first input control signal ($IN_{HS}$) and produce a first output control signal between a first high-side output node (120a) and a second high-side output node (102a) for controlling said high-side switch (HS), a low-side driver circuit (12b) configured to be coupled to a low-side switch (LS) of said half-bridge circuit, the low-side driver circuit (12b) configured to receive said second input control signal ($IN_{LS}$) and produce a second output control signal between a first low-side output node (120b) and a second low-side output node (102b) for controlling said low-side switch (LS), a floating supply node (104) configured to receive a floating supply voltage ($V_{CB}$, $C_B$) applied between said floating supply node (104) and said second high-side output node (102a), wherein the high-side driver circuit (12a) is electrically coupled between said floating supply node (104) and said second high-side output node (102a) to receive said floating supply voltage ($V_{CB}$), a bootstrap diode (D3) having an anode coupled to said first input supply node (100a) and a cathode coupled to an intermediate supply node (106), and a current limiter circuit (Q1', D1', 62) coupled between said intermediate supply node (106) and said floating supply node (104), wherein said current limiter circuit (Q1', D1', 62) is configured to sense (50) said floating supply voltage ($V_{CB}$) and to counter a current flow from said intermediate supply node (106) to said floating supply node (104) as a result of said floating supply voltage ($V_{CB}$) reaching a threshold value.

Said current limiter circuit may include a first field-effect transistor (Q1') having a respective first drain-body diode (D1'), the respective first drain-body diode (D1') having an anode coupled to said floating supply node (104) and a cathode coupled to said intermediate supply node (106).

Said current limiter circuit may include a second field-effect transistor (Q2) having a respective second drain-body diode (D2), the respective second drain-body diode (D2) having an anode coupled to said floating supply node (104) and a cathode coupled to said intermediate supply node (106), a capacitance (C4) coupled between said intermediate supply node (106) and a gate terminal of said second field-effect transistor (Q2), and a resistance (R4) coupled between said floating supply node (104) and said gate terminal of said second field-effect transistor (Q2).

Said current limiter circuit may include a status comparator circuit (DT1) configured to compare said first supply voltage ($V_{CC}$) to a switching voltage ($V_{OUT}$) sensed between said second high-side output node (102a) and said second low-side output node (102b), and wherein the current limiter circuit is configured to switch to a conductive state said first field-effect transistor (Q1') in response to said switching voltage ($V_{OUT}$) being higher than said first supply voltage ($V_{CC}$).

Said current limiter circuit may include an overvoltage comparator circuit (DT2) configured to compare a signal ($V_R$) indicative of said floating supply voltage ($V_{CB}$) to a reference signal ($V_{REF}$), and wherein said current limiter circuit is configured to switch to a non-conductive state said first field-effect transistor (Q1') in response to said signal ($V_R$) indicative of said floating supply voltage ($V_{CB}$) being higher than said reference signal ($V_{REF}$).

Said current limiter circuit may include a logic gate (70) configured to generate an output logic signal (Q1off) as a function of an output signal (HBlow) from said status comparator circuit (DT1) and an output signal (VBOov) from said overvoltage comparator circuit (DT2), wherein said first field-effect transistor (Q1') switches to a non-conductive state in response to said output logic signal (Q1off) having a high value and to a conductive state in response to said output logic signal (Q1off) having a low value, and wherein the circuit (HBD) includes a resistive current flow path (R0) between an output node of said logic gate (70) and said second high-side output node (102a).

Said current limiter circuit may include a switch (S1) configured to selectively couple a gate terminal of said first field-effect transistor (Q1') either to said intermediate supply node (106) to receive a positive voltage ($V_S$) or to a further voltage node, wherein said further voltage node is configured (VG3) to provide a voltage ($V_{R3}$) lower than said positive voltage ($V_S$).

Said bootstrap diode may include a bootstrap field-effect transistor (Q3) having a respective drain-body diode (D3), the respective drain-body diode (D3) having an anode coupled to said first input supply node (100a) and a cathode coupled to said intermediate supply node (106).

The circuit (HBD) may include a supply comparator circuit (DT3) configured to compare said first supply voltage ($V_{CC}$) to a threshold supply voltage ($V_{REF,CC}$), and a logic circuit (LOG2) configured to switch to a non-conductive state said bootstrap field-effect transistor (Q3) in response to said first supply voltage ($V_{CC}$) being lower than said threshold supply voltage ($V_{REF,CC}$).

The circuit (HBD) may include a bootstrap comparator circuit (DT4) configured to compare a voltage ($V_{BOOT}$) at said floating supply node (104) to said first supply voltage ($V_{CC}$), and a logic circuit (LOG2) configured to switch to a non-conductive state said bootstrap field-effect transistor (Q3) in response to said voltage ($V_{BOOT}$) at said floating supply node (104) being higher than said first supply voltage ($V_{CC}$).

The circuit (HBD) may include a logic circuit (LOG2) sensitive to a control signal (LSon) indicative of whether said low-side switch (LS) is in a conductive state or in a non-conductive state, wherein said logic circuit (LOG2) is configured to switch to a non-conductive state said bootstrap field-effect transistor (Q3) in response to said control signal (LSon) indicating that said low-side switch (LS) is in a non-conductive state.

The circuit (HBD) may include a level shifter circuit (14) configured to propagate said first input control signal ($IN_{HS}$) from said first input control node to said high-side driver circuit (12a), wherein the level shifter circuit (14) is electrically powered between said intermediate supply node (106) and said second input supply node (100b).

The level shifter circuit (14) may include a first current flow line between said intermediate supply node (106) and said second input supply node (100b), the first current flow line including a first transistor (N1) having a source terminal coupled to said second input supply node (100b) and a first resistance (R11) coupled between a drain terminal (110) of the first transistor (N1) and said intermediate supply node (106), the first transistor (N1) having a respective control terminal configured to receive said first input control signal ($IN_{HS}$), and a second current flow line between said intermediate supply node (106) and said second high-side output node (102a), the second current flow line including a second transistor (P1) having a source terminal coupled to said intermediate supply node (106) and a second resistance (R12) coupled between a drain terminal (112) of the second transistor (P1) and said second high-side output node (102a), the second transistor (P1) having a respective control terminal coupled to the drain terminal (110) of the first transistor (N1).

The circuit (10') may further include said high-side switch (HS) configured to provide a current flow line between a third input supply node (108) and the second high-side output node (102a), wherein the third input supply node (108) is configured to receive a second supply voltage ($V_{BUS}$) higher than said first supply voltage ($V_{CC}$), and said low-side switch (LS) configured to provide a current flow line between the second high-side output node (102a) and the second low-side output node (102b), wherein the second high-side output node (102a) and the second low-side output node (102b) are configured to provide said switching voltage ($V_{OUT}$) therebetween.

Said high-side switch (HS) and said low-side switch (LS) may include gallium nitride power transistors.

A device, may be summarized as including a circuit (10') according to claim 14 or claim 15, a bootstrap capacitor ($C_B$) coupled between said floating supply node (104) and said second high-side output node (102a) of said circuit (10'), and an inductive load (L) coupled between said second high-side output node (102a) and said second low-side output node (102b) of said circuit (10') to receive said switching voltage ($V_{OUT}$).

A method of operating a circuit (HBD, 10') may be summarized as including receiving a first supply voltage ($V_{CC}$) between said first input supply node (100a) and said second input supply node (100b), receiving a first input control signal ($IN_{HS}$) at said first input control node and a second input control signal ($IN_{LS}$) at said second input control node, producing (12a) a first output control signal between said first high-side output node (120a) and said second high-side output node (102a) for controlling a high-side switch (HS) of a half-bridge circuit, producing (12b) a second output control signal between said first low-side output node (120b) and said second low-side output node (102b) for controlling a low-side switch (LS) of said half-bridge circuit, receiving a floating supply voltage ($V_{CB}$, $C_B$) applied between said floating supply node (104) and said second high-side output node (102a) to power said high-side driver circuit (12a), sensing (50) said floating supply voltage ($V_{CB}$) and countering a current flow from said intermediate supply node (106) to said floating supply node (104) as a result of said floating supply voltage ($V_{CB}$) reaching a threshold value.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
   a first input supply node and a second input supply node configured to receive a first supply voltage applied differentially therebetween;
   a first input control node configured to receive a first input control signal and a second input control node configured to receive a second input control signal;
   a high-side driver circuit configured to be coupled to a high-side switch of a half-bridge circuit, the high-side driver circuit being configured to receive the first input control signal and produce a first output control signal differentially between a first high-side output node and a second high-side output node for controlling the high-side switch;
   a low-side driver circuit configured to be coupled to a low-side switch of the half-bridge circuit, the low-side driver circuit configured to receive the second input control signal and produce a second output control signal differentially between a first low-side output node and a second low-side output node for controlling the low-side switch;
   a floating supply node configured to receive a floating supply voltage applied differentially between the floating supply node and the second high-side output node, wherein the high-side driver circuit is electrically coupled between the floating supply node and the second high-side output node to receive the floating supply voltage;
   an intermediate supply node;
   a bootstrap diode having an anode coupled to the first input supply node and a cathode coupled to the intermediate supply node; and
   a current limiter circuit coupled between the intermediate supply node and the floating supply node,
   wherein the current limiter circuit is configured to sense the floating supply voltage and, in response to the floating supply voltage reaching a threshold value, counter a current flow from the intermediate supply node to the floating supply node.

2. The circuit of claim 1, wherein the current limiter circuit includes:
   a first field-effect transistor having a respective first drain-body diode, the respective first drain-body diode having an anode coupled to the floating supply node and a cathode coupled to the intermediate supply node.

3. The circuit of claim 2, wherein the current limiter circuit includes:
   a second field-effect transistor having a respective second drain-body diode, the respective second drain-body diode having an anode coupled to the floating supply node and a cathode coupled to the intermediate supply node;
   a capacitance coupled between the intermediate supply node and a gate terminal of the second field-effect transistor; and
   a resistance coupled between the floating supply node and the gate terminal of the second field-effect transistor.

4. The circuit of claim 2, wherein the current limiter circuit includes a status comparator circuit configured to compare the first supply voltage to a switching voltage sensed differentially between the second high-side output node and the second low-side output node, and wherein the current limiter circuit is configured to operate the first field-effect transistor in a conductive state in response to the switching voltage exceeding the first supply voltage.

5. The circuit of claim 2, wherein the current limiter circuit includes an overvoltage comparator circuit configured to compare a signal representative of the floating supply voltage to a reference signal, and wherein the current limiter circuit is configured to operate the first field-effect transistor in a non-conductive state in response to the signal indicative of the floating supply voltage exceeding the reference signal.

6. The circuit of claim 4, wherein the current limiter circuit includes a logic gate configured to generate an output logic signal as a function of an output signal of the status comparator circuit and an output signal of the overvoltage comparator circuit, wherein the first field-effect transistor operates in a non-conductive state in response to the output logic signal having a first state and operates in a conductive state in response to the output logic signal having a second state, and wherein the circuit comprises a resistive current flow path between an output node of the logic gate and the second high-side output node.

7. The circuit of claim 2, wherein the current limiter circuit includes a switch configured to selectively couple a gate terminal of the first field-effect transistor either to the intermediate supply node to receive a positive voltage or to a further voltage node, wherein the further voltage node is configured to provide a voltage lower than the positive voltage.

8. The circuit of claim 1, wherein the bootstrap diode includes a bootstrap field-effect transistor having a respective drain-body diode, the respective drain-body diode having an anode coupled to the first input supply node and a cathode coupled to the intermediate supply node.

9. The circuit of claim 8, further comprising:
a supply comparator circuit configured to compare the first supply voltage to a threshold supply voltage; and
a logic circuit configured to operate the bootstrap field-effect transistor in a non-conductive state in response to the first supply voltage being lower than the threshold supply voltage.

10. The circuit of claim 8, further comprising:
a bootstrap comparator circuit configured to compare a voltage at the floating supply node to the first supply voltage; and
a logic circuit configured to switch to operate the bootstrap field-effect transistor in a non-conductive state in response to the voltage at the floating supply node exceeding the first supply voltage.

11. The circuit of claim 8, further comprising:
a logic circuit configured to:
receive a control signal indicative of whether the low-side switch is in a conductive state or in a non-conductive state; and
operate the bootstrap field-effect transistor in a non-conductive state in response to the control signal indicating that the low-side switch is in a non-conductive state.

12. The circuit of claim 1, further comprising:
a level shifter circuit configured to propagate the first input control signal from the first input control node to the high-side driver circuit, wherein the level shifter circuit is electrically coupled to the intermediate supply node and the second input supply node.

13. The circuit of claim 12, wherein the level shifter circuit comprises:
a first circuit coupled between the intermediate supply node and the second input supply node, the first circuit including:
a first transistor having a first conduction terminal coupled to the second input supply node and a second conduction terminal configured to receive the first input control signal, the first transistor having a control terminal; and
a first resistance coupled between the second conduction terminal of the first transistor and the intermediate supply node; and
a second circuit coupled between the intermediate supply node and the second high-side output node, the second circuit including:
a second transistor having a first conduction terminal coupled to the intermediate supply node and a control terminal coupled to the second conduction terminal of the first transistor, the second transistor having a second conduction terminal; and
a second resistance coupled between the second conduction terminal of the second transistor and the second high-side output node.

14. The circuit of claim 1, further comprising:
the high-side switch configured to provide a current flow line between a third input supply node and the second high-side output node, wherein the third input supply node is configured to receive a second supply voltage higher than the first supply voltage; and
the low-side switch configured to provide a current flow line between the second high-side output node and the second low-side output node,
wherein the second high-side output node and the second low-side output node are configured to provide the switching voltage therebetween.

15. The circuit of claim 14, wherein the high-side switch and the low-side switch includes gallium nitride power transistors.

16. A device, comprising:
a circuit including:
a first input supply node and a second input supply node configured to receive a first supply voltage applied differentially therebetween;
a first input control node configured to receive a first input control signal and a second input control node configured to receive a second input control signal;
a high-side driver circuit configured to be coupled to a high-side switch of a half-bridge circuit, the high-side driver circuit being configured to receive the first input control signal and produce a first output control signal differentially between a first high-side output node and a second high-side output node for controlling the high-side switch;
a low-side driver circuit configured to be coupled to a low-side switch of the half-bridge circuit, the low-side driver circuit configured to receive the second input control signal and produce a second output control signal differentially between a first low-side output node and a second low-side output node for controlling the low-side switch;
a floating supply node configured to receive a floating supply voltage applied differentially between the floating supply node and the second high-side output node, wherein the high-side driver circuit is electrically coupled between the floating supply node and the second high-side output node to receive the floating supply voltage;
an intermediate supply node;
a bootstrap diode having an anode coupled to the first input supply node and a cathode coupled to the intermediate supply node; and
a current limiter circuit coupled between the intermediate supply node and the floating supply node, wherein the current limiter circuit is configured to sense the floating supply voltage and, in response to the floating supply voltage reaching a threshold value, counter a current flow from the intermediate supply node to the floating supply node;
a bootstrap capacitor coupled between the floating supply node and the second high-side output node; and
an inductive load coupled between the second high-side output node and the second low-side output node and configured to receive the switching voltage.

17. The device of claim 16, wherein the current limiter circuit includes:
a first field-effect transistor having a respective first drain-body diode, the respective first drain-body diode having an anode coupled to the floating supply node and a cathode coupled to the intermediate supply node.

18. The device of claim 16, wherein the bootstrap diode includes:
a bootstrap field-effect transistor having a respective drain-body diode, the respective drain-body diode having an anode coupled to the first input supply node and a cathode coupled to the intermediate supply node.

19. A method comprising:
receiving a first supply voltage differentially between a first input supply node and a second input supply node;
receiving a first input control signal at a first input control node and a second input control signal at a second input control node;
producing a first output control signal differentially between a first high-side output node and a second high-side output node for controlling a high-side switch of a half-bridge circuit;
producing a second output control signal differentially between a first low-side output node and a the second low-side output node for controlling a low-side switch of the half-bridge circuit;
receiving a floating supply voltage applied differentially between a floating supply node and the second high-side output node to power a high-side driver circuit;
sensing the floating supply voltage by a current limiter circuit coupled between an intermediate supply node and the floating supply node, wherein a bootstrap diode has an anode coupled to the first input supply node and a cathode coupled to the intermediate supply node; and
in response to the floating supply voltage reaching a threshold value, countering, by the current limiter circuit, a current flow from the intermediate supply node to the floating supply node.

20. The method of claim 19, further comprising:
comparing the first supply voltage to a switching voltage sensed differentially between the second high-side output node and the second low-side output node; and
in response to the switching voltage exceeding the first supply voltage, operating a switch coupled between the floating supply node and the intermediate supply node in a conductive state.

21. The method of claim 19, further comprising:
comparing a signal representative of the floating supply voltage to a reference signal; and
in response to the signal indicative of the floating supply voltage exceeding the reference signal, operating a switch coupled between the floating supply node and the intermediate supply node in a non-conductive state.

\* \* \* \* \*

UNITED STATES PATENT AND TRADEMARK OFFICE
CERTIFICATE OF CORRECTION

| | | |
|---|---|---|
| PATENT NO. | : 11,476,845 B2 | Page 1 of 1 |
| APPLICATION NO. | : 17/355055 | |
| DATED | : October 18, 2022 | |
| INVENTOR(S) | : Marco Giovanni Fontana et al. | |

It is certified that error appears in the above-identified patent and that said Letters Patent is hereby corrected as shown below:

In the Claims

<u>In Column 25, Claim 19, Line 25:</u>
"and a the second" should read: -- and a second --.

Signed and Sealed this
Thirty-first Day of January, 2023

Katherine Kelly Vidal
*Director of the United States Patent and Trademark Office*